United States Patent
Ye et al.

(10) Patent No.: US 6,178,920 B1
(45) Date of Patent: *Jan. 30, 2001

(54) PLASMA REACTOR WITH INTERNAL INDUCTIVE ANTENNA CAPABLE OF GENERATING HELICON WAVE

(75) Inventors: Yan Ye, Campbell; Allan D'Ambra, Milbrae; Yeuk-Fai Edwin Mok, Santa Clara; Richard E. Remington, Fremont; James E. Sammons, III, Santa Clara, all of CA (US)

(73) Assignee: Applied Materials, Inc., Santa Clara, CA (US)

( * ) Notice: Under 35 U.S.C. 154(b), the term of this patent shall be extended for 0 days.

This patent is subject to a terminal disclaimer.

(21) Appl. No.: 09/336,512

(22) Filed: Jun. 18, 1999

Related U.S. Application Data

(63) Continuation-in-part of application No. 09/158,563, filed on Sep. 22, 1998, which is a continuation-in-part of application No. 08/869,798, filed on Jun. 5, 1997, now Pat. No. 6,071,372.

(51) Int. Cl.[7] .............................. C23C 16/00; H05H 1/00
(52) U.S. Cl. .......................................... 118/723 I; 156/345
(58) Field of Search .......................... 118/723 I, 723 A; 156/345; 204/298.01, 298.08, 298.09, 298.16; 216/68; 315/111.21

(56) References Cited

U.S. PATENT DOCUMENTS

| | | |
|---|---|---|
| 3,569,777 | 3/1971 | Beaudry . |
| 4,865,712 | 9/1989 | Mintz . |
| 4,918,031 | 4/1990 | Flamm et al. . |

(List continued on next page.)

FOREIGN PATENT DOCUMENTS

| | | |
|---|---|---|
| 42 27 296 C1 | 10/1993 | (DE) . |
| 0 459 177 A2 | 12/1991 | (EP) . |

(List continued on next page.)

OTHER PUBLICATIONS

Hopwood, J., Qian, F., "Mechanisms for Highly Ionized magnetron Sputtering," *J. Appl. Phys.*, 78(2), Jul. 15, 1995, pp. 758–765.

(List continued on next page.)

*Primary Examiner*—Gregory Mills
*Assistant Examiner*—Parviz Hassanzadeh
(74) *Attorney, Agent, or Firm*—Michaelson and Wallace

(57) ABSTRACT

The present invention employs an internal inductive antenna capable of generating a helicon wave for generating a plasma. One embodiment of the present invention employs loop type antenna secured within a bell shaped portion of the chamber. Another embodiment employs a flat coil type antenna secured within the chamber. In the preferred embodiments, the internal antenna of the present invention is constructed to prevent sputtering of the antenna. The antenna may be formed of a non-sputtering conductive material, or may formed a conductive material surrounded, completely or partially, by a non-sputtering jacket. In one embodiment, the non-sputtering jacket may be coupled to the chamber wall so that heat generated by the antenna is transferred between the jacket and the chamber wall by conduction. Preferably, the non-sputtering jacket is formed of a material that also is electrically insulative with the surface of the antenna exposed to plasma being segmented to inhibit eddy current in conductive deposits. The gaps separate the exposed surface of the antennas so that conductive deposits are inhibited from electrically joining the separated surfaces, while inhibiting plasma generation within the gaps. A portion or all of the chamber wall may be constructed of electrically and thermally conductive material.

29 Claims, 16 Drawing Sheets

U.S. PATENT DOCUMENTS

| | | |
|---|---|---|
| 4,948,458 | 8/1990 | Ogle . |
| 5,175,608 | 12/1992 | Nihei et al. . |
| 5,178,739 | 1/1993 | Barnes et al. . |
| 5,187,454 | 2/1993 | Collins et al. . |
| 5,231,334 * | 7/1993 | Paranjpe ........................... 315/111.21 |
| 5,285,046 | 2/1994 | Hansz . |
| 5,346,578 | 9/1994 | Benzing et al. . |
| 5,349,313 | 9/1994 | Collins et al. . |
| 5,392,018 | 2/1995 | Collins et al. . |
| 5,401,358 | 3/1995 | Patrick et al. . |
| 5,434,353 | 7/1995 | Kraus . |
| 5,460,707 | 10/1995 | Wellerdieck . |
| 5,464,476 | 11/1995 | Gibb et al. . |
| 5,540,824 | 7/1996 | Yin et al. . |
| 5,554,223 | 9/1996 | Imahashi . |
| 5,558,722 | 9/1996 | Okumura et al. . |
| 5,587,038 | 12/1996 | Cecchi et al. . |
| 5,591,493 | 1/1997 | Paranjpe et al. . |
| 5,637,961 | 6/1997 | Ishii et al. . |
| 5,647,913 | 7/1997 | Blalock . |
| 5,653,811 | 8/1997 | Chan . |
| 5,683,537 * | 11/1997 | Ishii . |
| 5,702,530 | 12/1997 | Shan et al. . |
| 5,846,883 | 12/1998 | Moslehi . |
| 5,998,933 * | 12/1999 | Shun'ko ........................... 118/723 I |

FOREIGN PATENT DOCUMENTS

| | | |
|---|---|---|
| 61-190070 | 8/1986 | (JP) . |
| 6-219323 | 9/1994 | (JP) . |
| 97/08734 * | 3/1997 | (WO) ........................... H01J/37/35 |

OTHER PUBLICATIONS

Quick, A.K., Chen, R.T.S., and Hershkowitz, N., "Etch rate and plasma density radial uniformity measurements in a cusped field helicon plasma etcher," *J. Vac. Sci. Technol.*, vol. 14, No. 14, No. 3, May/Jun. 1996, pp. 1041–1045.

Rossnagel, S.M., "Directional and Ionized Sputter Deposition for Microelectronics Applications," *Proc. of the 3rd ISSP*, Tokyo, 1995, pp. 253–260, (no month).

Rossnagel, S.M., "Ionized Magnetron Sputtering for Lining and Filling Trenches and Vias," *Semiconductor International*, Feb. 1996, pp. 99–102.

Rossnagel, S.M., Hopwood J., "Magnetron sputter deposition with high levels of metal ionization," *Appl. Phys. Lett.*, vol. 63, No. 24, Dec. 13, 1993, pp. 3258–3287.

Rossnagel, S.M., Hopwood, J., Metal ion deposition from ionized magnetron sputtering discharge, *J. Vac. Sci. Technol.*, Jan./Feb. 1994, pp. 449–453.

Stevens, J.E., Sowa, M.J., and Cecchi, J.L., "Helicon plasma source excited by a flat spiral coil," *J. Vac. Sci. Technol.*, vol. 13, No. 5, Sep./Oct. 1995, pp. 2476–2482.

Stewart, R.A., Vitello, P., Graves, D.B., Jaeger, E.F., and Berry, L.A., "Plasma uniformity in high–density inductively coupled plasma tools,"*IOP Publishing Ltd.*, University of California, Berkley 1995, pp. 36–46, (no month).

Yamashita, M., "Fundamental characteristics of built–in–high–frequency coil–type sputtering apparatus," *J. Vac. Sci. Technol.*, A 7(2), Mar./Apr., 1989, pp. 151–158.

Patent Abstracts of Japan, Publication No. 08078191 A, Mar. 22, 1996 (Kobe Steel Ltd).

Patent Abstracts of Japan, Publication No. 07161695 A, Mar. 23, 1995 (Tokyo Electron Ltd).

* cited by examiner

PLASMA REACTOR WITH INTERNAL INDUCTIVE ANTENNA CAPABLE OF GENERATING HELICON WAVE

CROSS REFERENCE

This is a continuation-in-part of U.S. patent application Ser. No. 09/158,563, filed Sep. 22, 1998, by Ye, et al., entitled RF PLASMA ETCH REACTOR WITH INTERNAL INDUCTIVE COIL ANTENNA AND ELECTRICALLY CONDUCTIVE CHAMBER WALLS, which is a continuation-in-part of U.S. patent application Ser. No. 08/869,798, filed Jun. 5, 1997 now U.S. Pat. No. 6,071,372 by Ye, et al., entitled RF PLASMA ETCH REACTOR WITH INTERNAL INDUCTIVE COIL ANTENNA AND ELECTRICALLY CONDUCTIVE CHAMBER WALLS, both herein incorporated by reference in their entireties.

BACKGROUND OF THE INVENTION

1. Technical Field

The invention relates to inductive antenna plasma reactors.

2. Background Art

Conventional inductively coupled plasma reactors typically have a large coiled inductive antenna to provide RF power for generating plasma. The large coil antenna, typically is located outside the reactor chamber and couples RF power through the chamber wall. Such a configuration has several drawbacks.

A problem with conventional helicon source reactors is that conductive material may deposit on the walls of the reactor and degrade the efficiency and performance of the reactor. With a conventional etch reactors has in the past been used to etch aluminum from the surface of a workpiece. This etching process produces byproducts comprising mostly aluminum chlorides (AlClx) and fragments of photoresist, which tend to deposit on the walls of the reactor chamber. The byproducts of an aluminum etch have no significant effect on etch rates because they are almost totally non-conductive. Such is not the case when electrically conductive etch byproducts are produced and deposited on the chamber surfaces. For example, etching of copper (Cu), platinum (Pt), tantalum (Ta), rhodium (Rh), and titanium (Ti), among others may create electrically conductive etch byproducts. Etching these metals presents a problem when using the conventional helicon source reactor.

Conductive deposits on the reactor walls can degrade reactor performance in several ways. Conductive deposits on the wall can reduce inductive power transfer to the plasma. The ceiling and/or upper portion of the side wall of the reactor chamber typically are made of a non-conductive material, such as quartz or glass, to facilitate the transfer of power from the inductive coil antenna to the plasma. A coating formed by the conductive material on the walls and ceiling of the chamber has the effect of attenuating the power coupled to the plasma from the inductive antenna of the helicon source.

As the interior surface of the chamber under the antenna is coated with a conductive material, eddy currents are produced in the material which attenuates the power coupled to the plasma. As the conductive coating builds in thickness over successive processes, the attenuation progressively increases and the power coupling into the plasma progressively decreases. Such a reduction in inductive power coupling into the chamber reduces the etch rate and can even cause problems igniting and maintaining a plasma.

The conductive coating also can cause unexpected changes in the characteristics of applied bias power. Typically, the lower portion of the reactor walls are made of an electrically conductive material, and are grounded to form an anode of a bias circuit used to control ion energy at the workpiece. The characteristics of the bias circuit, which controls ion energy at the workpiece, are important in controlling processing, and are particularly important during etching, as etching is ion driven.

The conductive coating formed on the insulated portion of the chamber walls can electrically connect to the grounded anode portion of the chamber. This effectively increases the anode area and results in an unexpected change in the bias power.

The reduction of inductively coupled power and the increase in capacitive bias power have detrimental effects on the etch process. The plasma ion density is lowered due to the decrease in inductively coupled power, and the plasma ion energy is increased due to the increase in capacitive bias power. As the power levels typically are set prior to the etching process to optimize plasma ion density and energy, any change could have an undesirable impact on etch quality. For instance, photoresist selectivity is lowered, etch stop depths are reduced, and ion current/energy distribution and the etch rate are adversely affected. Furthermore, unwanted changes in the etch profile may occur even after only two or three workpieces have been etched.

Of course, the decrease in inductively coupled power could be compensated for by increasing the inductive power supplied to the inductive antenna. Similarly, the increase in capacitively bias power can be compensated for by decreasing the power supplied to the pedestal. Or, the chamber walls could be cleaned more often than would typically be necessary when etching materials producing non-conductive by-products.

These types of work-arounds, however, are generally impractical. A user of a plasma reactor typically prefers to set the respective power levels in accordance with a so-called "recipe" supplied by the reactor's manufacturer. Having to deviate from the recipe to compensate for the conductive deposits would be unacceptable to most users. Furthermore, it is believed that the aforementioned detrimental effects will be unpredictable, and therefore, the required changes in the power settings could not be predetermined. Thus, unless the user employs some form of monitoring scheme, the required compensating changes in power inputs would be all but impossible for a user to implement. Realistically, the only viable solution would be to clean the chamber frequently, perhaps as often as after the completion of each etch operation. An increase in the frequency of cleaning, however, would be unacceptable to most users as it would lower throughput rates and increase costs significantly.

Another problem with conventional helicon reactors is that the ratio of the surface area of the anode portion of the wall to the pedestal is too small. Since a large portion of the wall must be electrically non-conductive to facilitate inductive power transfer to the plasma, only a small portion of the wall is electrically conductive and may act as the anode for the capacitive bias supplied by an RF power source. It is desirable to have the surface area of the pedestal significantly less than that of the grounded portion so that the average voltage (often referred to as the DC bias voltage) at the surface of the workpiece is negative. This average negative voltage is employed to draw the positively charged ions from the plasma to the workpiece. If, however, the surface area of the pedestal is only slightly smaller than the surface area of the grounded portion, as is typically the case in a conventional inductively coupled plasma etch reactor, the average negative voltage at the surface of the workpiece is relatively small. This small average bias voltage results in a weak attracting force which provides a relatively low average ion energy. A higher negative bias voltage value than typically can be obtained using a conventional inductively coupled plasma etch reactor is necessary to optimize the plasma ion energy so as to ensure maximum etch rate while not creating significant damage to the workpiece. Ideally, the surface area of the grounded portion of the wall would be sufficiently large in comparison with that of the pedestal so as to produce the maximum possible negative average voltage at he surface of the workpiece, i.e. one half the peak to peak voltage.

Yet another drawback associated with the conventional helicon source reactor involves the cooling of the walls of the chamber. Most processes typically are only stable and efficient if the chamber temperature is maintained within a narrow range. Since the formation of the plasma generates heat which can raise the chamber temperature above the required narrow range, it is desirable to remove heat from the chamber in order to maintain an optimum temperature within the chamber. This typically is accomplished by flowing coolant fluid through cooling channels formed within the conductive portion of the chamber wall. As it is not easy to form cooling channels within the insulative portion of the chamber walls, air is directed over the exterior of these walls. A problem arises in that the electrically insulative materials, such as quartz or ceramic, typically used to form the chamber walls also exhibit a low thermal conductivity. Thus, the chamber walls are not ideal for transferring heat from the chamber. As a result, the chamber temperature tends to fluctuate more than is desired in the region adjacent the insulative chamber walls because the heat transfer from the chamber is sluggish. Often the temperature fluctuations exceed the aforementioned narrow range required for efficient etch processing.

These excessive temperature fluctuations can cause another problem. As discussed previously, deposits will tend to deposit on the chamber walls during the etch process. In attempting to control the chamber temperature by air cooling the insulative chamber walls, the chamber wall temperature and the layer of deposits formed on the interior surface thereof, tends to cycle. This cycling causes thermal stresses within the layer of the deposited material which result in pieces of the material flaking off the wall and falling into the chamber. The loose deposit material can contaminate the workpiece, or it can settle at the bottom of the chamber thereby requiring frequent chamber cleaning.

SUMMARY

The present invention provides an improved helicon source plasma reactor employing an internal inductive antenna capable of generating a helicon wave for generating a plasma. A magnet or magnets disposed around the chamber provide an axial magnetic field to facilitate helicon wave propagation.

One embodiment of the present invention employs loop type antenna secured within a bell shaped portion of the chamber. Although it is possible to employ a single loop type to generate the helicon wave, it is presently preferred that the loop antenna be a double loops type antenna with two rings of magnets surrounding the wall of the bell shaped portion.

Another embodiment employs a flat coil type antenna secured within the chamber. A magnet disposed around the chamber provides the axial magnetic field adjacent the coil to facilitate helicon wave propagation.

In the preferred embodiments, the internal antenna of the present invention is constructed to prevent unwanted sputtering of the antenna. Although it is possible to form embodiments of the antenna of a non-sputtering conductive material, it is presently preferred to form the antennas of a conductive material surrounded, completely or partially, by a non-sputtering jacket. The non-sputtering jacket prevents plasma within the processing chamber from sputtering underlying material into the processing chamber.

In the preferred embodiments, the antenna is coupled to the chamber wall so that heat generated by the antenna is transferred between the jacket and the chamber wall by conduction. As such, the antenna may be coupled to the chamber wall, by brazing, screwing, seating, or otherwise bonding, fusing, or mechanically interlocking with it. This allows the temperature of the antenna, and in particular the jacket portion of the antenna, to be regulated by regulating the temperature of the chamber wall. Regulation of the jacket can help prevent cracking and flaking of the jacket and any deposits on the surface of the jacket. This extends the useful life of the antenna and prevents workpiece contamination.

Preferably, the non-sputtering jacket is formed of a material that also is electrically insulative and has low RF power attenuation. In such an embodiment, the surface of the antenna exposed to plasma may be segmented to reduce eddy current flow in conductive materials deposited on the surface of the antenna. With the coil antenna, the antenna may be segmented radially and/or the individual turns may be separated or segmented. With the loop antenna, the entire interior of the bell shaped portion of the chamber may be segmented into circumferential rings and/or arcuate segments, or only the portions adjacent the antenna conductor.

In the preferred embodiment, gaps separate the exposed surface of the antennas so that conductive deposits are inhibited from electrically joining the separated surfaces. Typically, the gaps are formed with side walls of sufficient length with respect to gap width to inhibit conductive deposits from joining the segmented surfaces, while inhibiting plasma generation within the gaps. In one embodiment, the gap is about 0.025 to 1 millimeter with the ratio of height to width being greater than about 5. As an alternative, or in addition to, the shape of the sidewalls forming the gap may be tailored to inhibit conductive byproduct from joining antenna segments. In another embodiment, the sidewalls step apart near the chamber wall so that the gap forms a "T" shape. The gaps may or may not extend all the way to the chamber walls.

In preferred embodiments, the chamber walls are constructed of electrically and thermally conductive material, such as aluminum, or the like, and the voltage potential of the walls may be controlled, such as by fixing the potential at ground. It is possible in some embodiments to form the wall of the bell portion of the chamber of glass or the like.

The portion of the conductive chamber walls exposed to plasma may have a coating, to inhibit sputtering of the chamber walls. The protective coating or layer prevents sputtering of material from the chamber walls by a plasma formed within the chamber. Absent this protective layer, sputtered material from the walls could degrade processing quality and contaminate the workpiece, thereby damaging the devices being formed thereon. In one embodiment, the electrically conductive chamber walls are made of aluminum with a protective layer of aluminum oxide (i.e. anodized aluminum). The protective layer, however, could also be a conductive ceramic material, such as for example boron carbide. It is also possible to form a magnetic bucket to protect exposed chamber walls, as is known in the art.

In some embodiments, an advantage of placing the antenna within the processing chamber is that it allows the size of the electrically conductive portion of the chamber walls, which acts as an anode for the DC bias circuit, to be increased. Providing a larger anode allows processing rates to be optimized while not creating significant damage to the workpiece.

In addition, since the chamber walls may be made conductive, any conductive deposits on the chamber walls will not have a detrimental effect on the plasma characteristics. For example, there would be no sudden increase in the capacitive coupling of RF power and ion energy caused by an electric coupling of the deposits to the grounded areas of the reactor which act as an anode for the energized workpiece pedestal. Thus, in some embodiments, the use of electrically grounded conductive chamber walls in combination with internal inductive antenna ensures, that the plasma characteristic do not change even when the process results in conductive deposits coating the interior walls of the chamber.

Chamber walls made of a conductive metals such as aluminum would also exhibit significantly greater thermal conductivity than that of conventionally employed electrically insulative materials such as quartz or ceramic. This results in a quicker transfer of heat from the antenna and the interior of the chamber to coolant fluid flowing through cooling channels formed in the chamber walls. Therefore, it is easier to maintain a narrow chamber temperature range and avoid the problems of a conventional reactor in connection with the cracking and flaking off of deposits from the chamber walls. Additionally, it is easier and less expensive to form cooling channels in aluminum chamber walls than in the conventional quartz walls.

In addition to the above-described advantages of the embodiment having conductive walls, the plasma characteristics may be better controlled by adjusting the amount of RF power supplied to the inductive antenna and the energized pedestal. For example, a capacitively coupled plasma can be formed by providing RF power solely to the pedestal (and/or the conductive chamber walls). Conversely, a purely inductively coupled plasma can be formed by providing RF power solely to the inductive antenna. Or, the reactor can be operated using any desired mix of inductively and capacitively coupled RF power. Thus, the reactor can be operated in an inductively coupled mode, capacitively coupled mode, or a combined mode. This provides the opportunity to use the reactor to perform a variety of operations over a wide process window.

In addition to the just described benefits, other objectives and advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

Figure 1A:
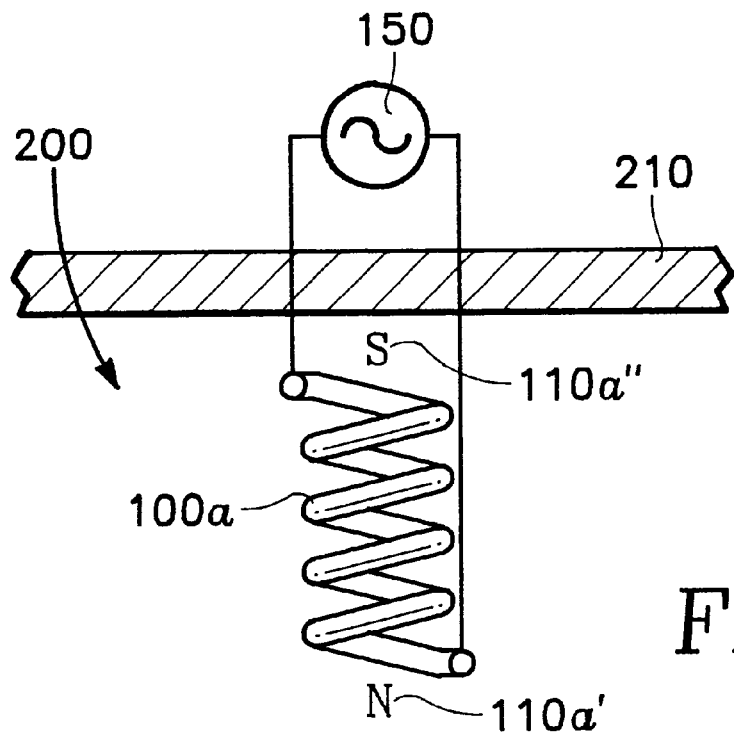
FIG. 1A is a side view of one of a small internal inductive coil type antenna within a wall of a plasma reactor.
Figure 1B:
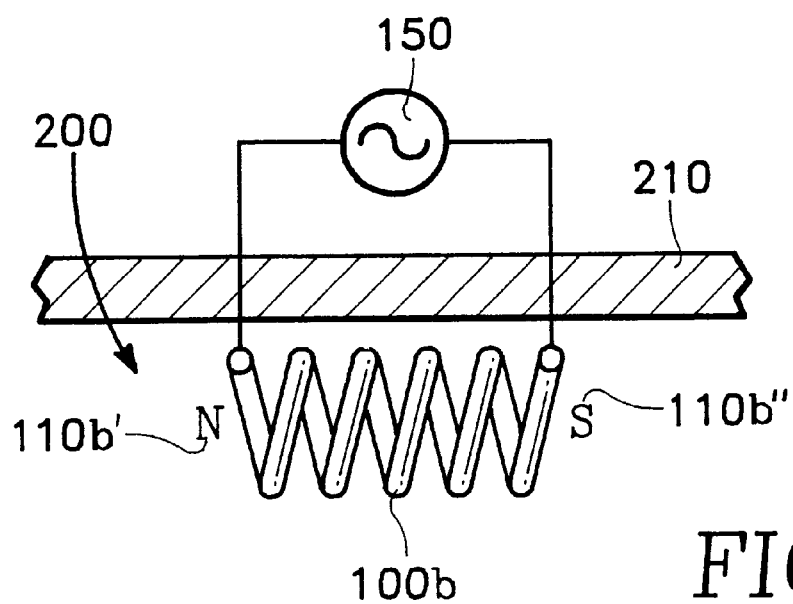
FIG. 1B is a side view of one of a small internal inductive coil type antenna within a wall of a plasma reactor.

FIGS. 1A & 1B illustrate a small inductive coil 100 within a wall 210 of a plasma reactor chamber 200. The wall 210 may be any wall which typically define the chamber 200 such as a side wall, a top wall, or a bottom wall. An RF source 150 provides power to the small inductive coil 100. The small inductive coil induces a magnetic field (not shown), which in turn induces an electric field (not shown), that generates the plasma within the chamber 200.

With the internal inductive antennas of FIGS. 1A & 1B, the antennas may be immersed in plasma. Immersing the antennas in plasma allows more efficient coupling of inductive power to the plasma. With small internal inductive coils, in addition to orienting the coils perpendicular to a chamber wall, the coils may be oriented along a chamber wall. This allows for further improvement of power coupling to the plasma. FIGS. 1A & 1B, depict some possible orientations of the small inductive coil 100 within the chamber 200. Because the coil 100 is within the chamber 200, the coil may be oriented as shown in FIG. 1B to provide yet more efficient coupling of inductive power to the plasma. In FIG. 1B, the instantaneous magnetic field may be oriented so that both the pole regions 110b' & 110b" are exposed to plasma. The pole regions 110b' & 110b" deliver most of the inductive power. Therefore, by immersing the inductive antenna 100b in plasma, it is possible to further increase inductive power coupling to the plasma by orienting the antenna so that both poles 110b' & 110b" deliver inductive power to the plasma.

In a typical application, the plasma reactor may employ several small inductive coils to generate plasma for processing a workpiece. In such an embodiment, it is preferred to arrange the coils to provide a uniform plasma at the workpiece. With the present invention, the small inductive coils may be utilized to tailor the plasma uniformity inside the chamber by changing the location of the coils, by changing the orientation of the coils, or by changing the power deposition profile within the chamber by adjusting the magnitude and phase relationship of the RF inductive power through each of the individual coil antennas.

Figure 2A:
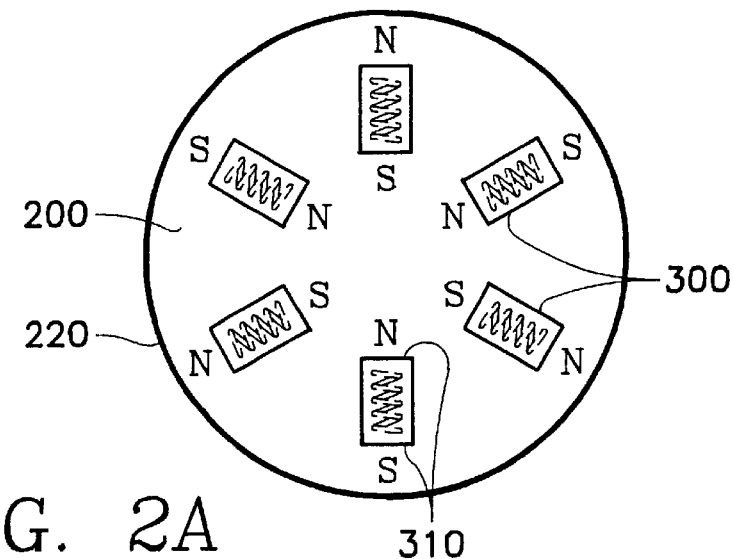
FIGS. 2A–2C are partial cut away top views of embodiments of a plasma reactor of the present invention illustrating possible orientations of the small internal inductive antennas of the present invention.
Figure 2B:
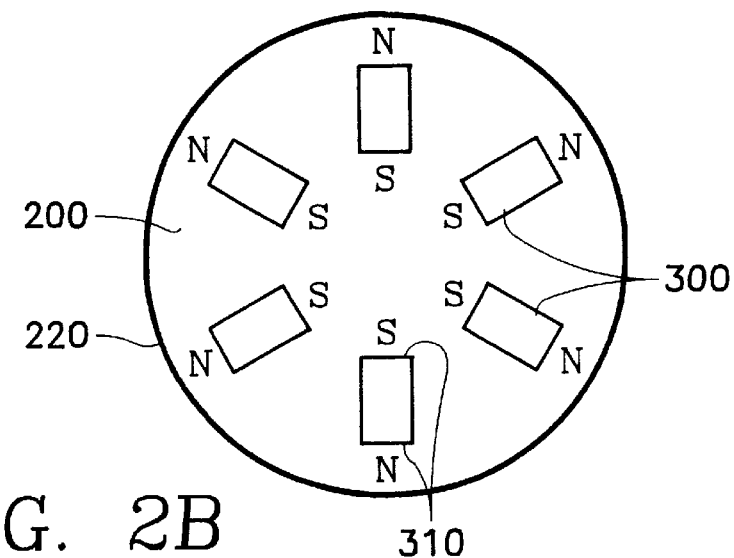
Figure 2C:
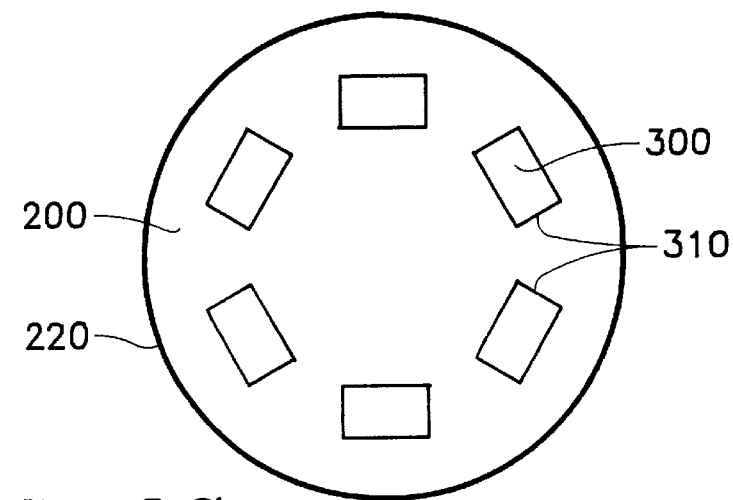

FIGS. 2A–2C are cut away top views showing possible arrangements of small internal inductive coil antennas 300 within the chamber 200. In FIGS. 2A–2C, the coil antennas are disposed around the center of the chamber 200. The small internal inductive coil antennas 300 may be near, or secured to, the top wall or ceiling of the chamber 200.

In FIGS. 2A & 2B, the coil antennas 300 are arranged so that the instantaneous magnetic field polarity 310 faces the center of the chamber 200. In FIG. 2A, the coil antennas 300 are driven by a power source (not shown), or by multiple power sources, so that the instantaneous magnetic field of adjacent antennas have the opposite polarity facing toward the center of the chamber 200. Also in the embodiment of FIG. 2A, opposing antennas have opposite polarity at poles 310 facing toward the center of the chamber 200.

In FIG. 2B, the coil antennas are driven so that the instantaneous magnetic field of adjacent antennas have the same polarity at the poles 310 facing toward the center of the chamber 200, and opposing antennas have the same polarity at the poles 310 facing toward the center of the chamber 200.

In FIG. 2C, the coil antennas 300 are arranged in a circular fashion with the poles 310 facing toward an adjacent antenna. As with the embodiments of FIGS. 2A & 2B, the interconnection of the coil antennas 300, and the phase relationship of the source power, may be selected so as to provide a uniform plasma at a workpiece. For example, in some applications, the neighboring poles of adjacent antennas may have the opposite polarity.

Figure 3:
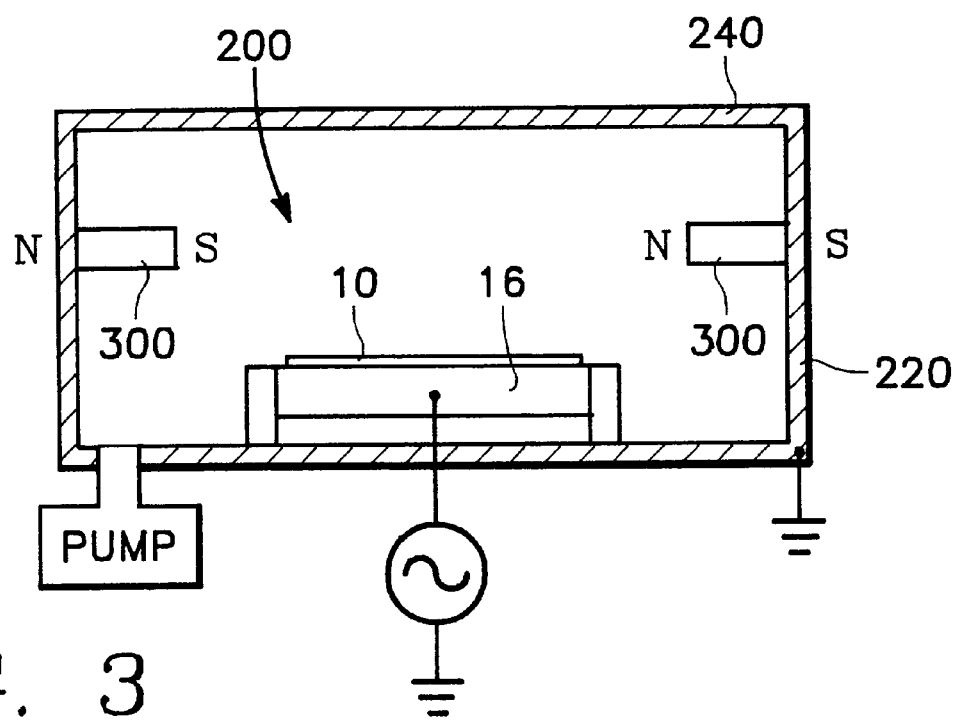
FIG. 3 is a cut away side view of a possible embodiment of a plasma reactor of the present invention illustrating possible arrangement of the small internal inductive antennas.
Figure 4:
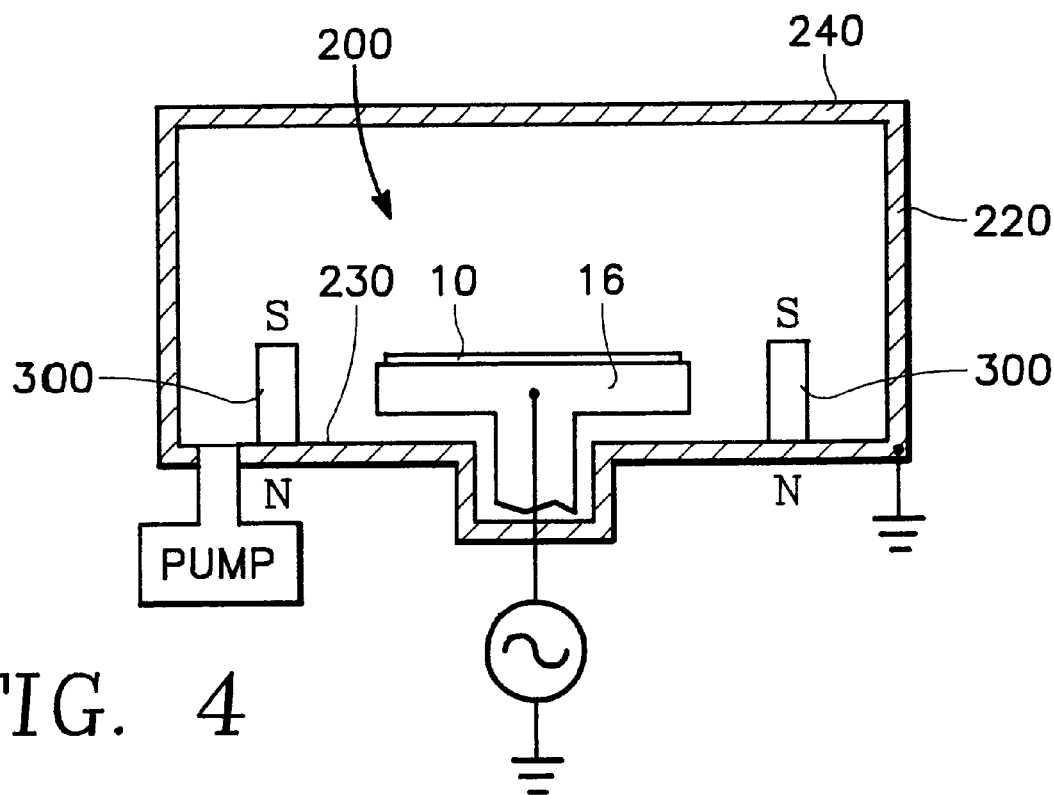
FIG. 4 is a cut away side view of a possible embodiment of a plasma reactor of the present invention illustrating possible arrangement of small internal inductive antennas.

It is possible to secure the coil antennas 300, of FIGS. 2A–2C to the side wall or walls of the chamber 220 as illustrated in FIG. 3. In addition, antennas may also be secured to the bottom wall 230 of the chamber 200 as shown in FIG. 4. Furthermore, any number of antennas 300 may be used to tailor the power distribution within the chamber 200. As such, it is possible to optimize plasma uniformity at the workpiece 10 by changing the number of antennas and their location within the chamber 200.

Figure 5:
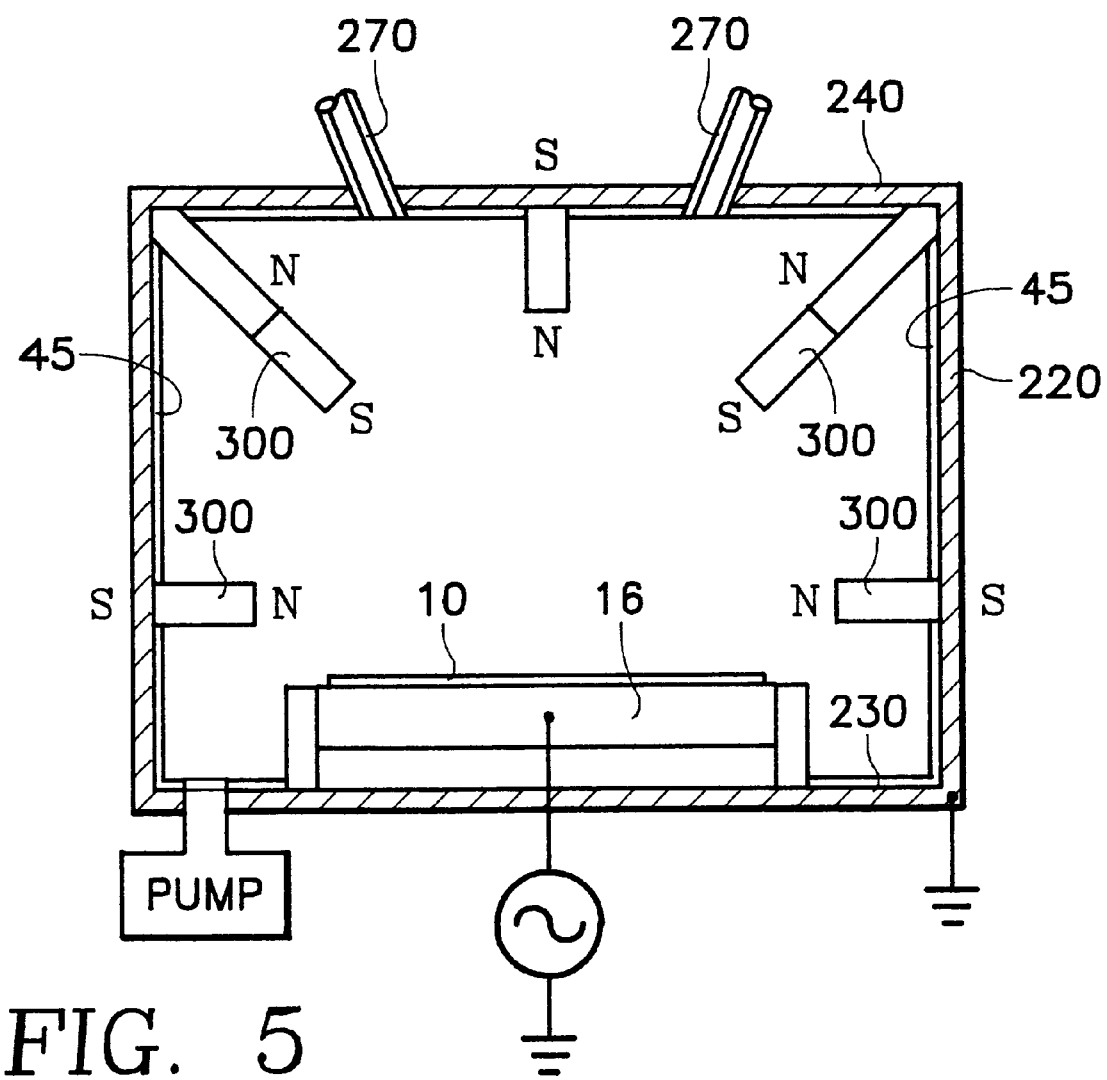
FIG. 5 is a cut away side view of a possible embodiment of a plasma reactor of the present invention illustrating possible arrangement of small internal inductive antennas along with process gas ports.

FIG. 5 illustrates another possible arrangement of coils within the chamber. The antennas 300 may be arranged in a spherical dome shape, as is partially depicted in FIG. 5. In addition to adjusting the location and the phase relationship of the antennas 300, the amplitude of the individual antenna coils also may be adjusted to optimize power deposition within the chamber 200. For example, more distal antennas may provide proportionally more power to the plasma than those closer to the pedestal 16.

Figure 6A:
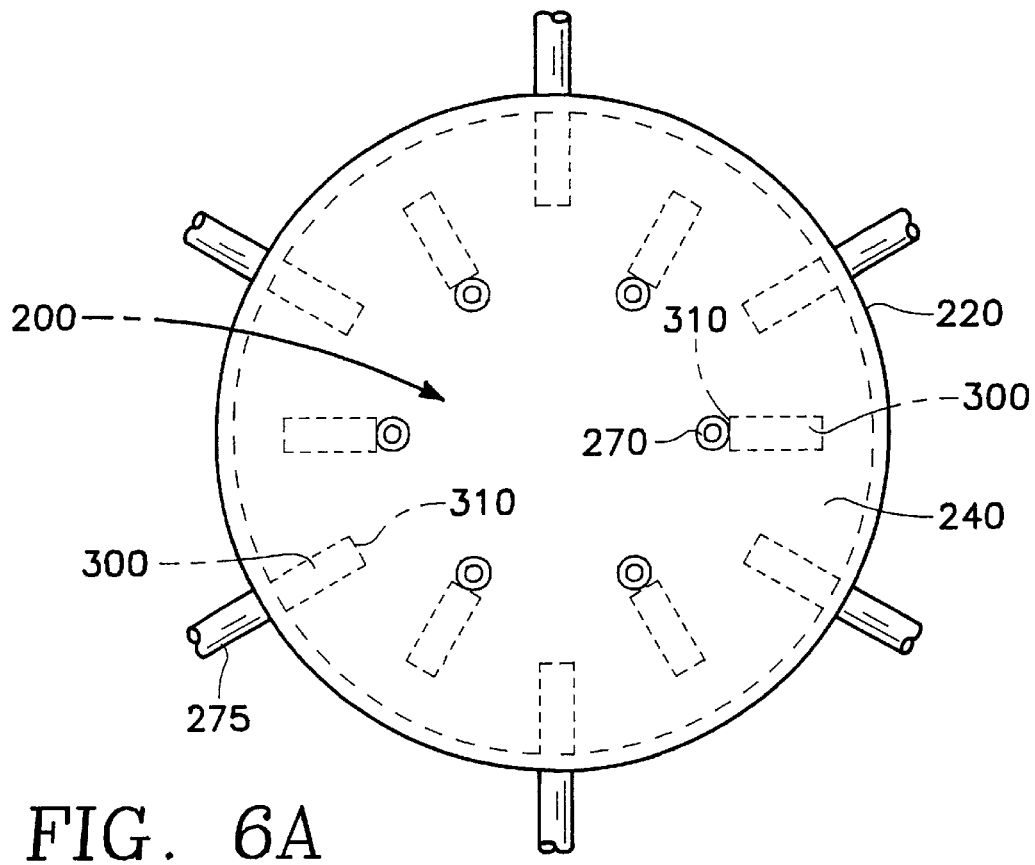
FIG. 6A is a top view of a possible embodiment of a plasma reactor of the present invention illustrating possible arrangement of small internal inductive antennas along with process gas ports.

In addition, the preferred embodiment of the present invention allows for improved control of plasma species densities. One way this may be accomplished is by selectively introducing precursor gas in areas of high, or low, power regions within the chamber. The power levels of the antennas 300 could be independently adjusted to control the plasma characteristics. For example, in the embodiment of FIG. 6, precursor gas or gases may be supplied through gas ports 270 placed near ceiling 240 mounted antennas 300, selected to provide high power, while gas ports 275 provide the same precursor gas or gases near low power sidewall 220 mounted antennas 300. Areas of high power may produce more ions, while areas of low power would produce more reactive neutrals. The overall characteristic of the plasma, therefore, could be controlled by adjusting the power levels supplied to each of the individual antennas 300.

It is also possible, to supply different plasma precursor gases into areas of high and low power deposition. In such and embodiment, a gas with a high ionization energy could be supplied into a high power region, such as near a pole 310, while plasma precursor gases with lower ionization energy could be introduced in areas of low power. For example, with the embodiment of FIGS. 6A & 6B, one precursor gas with high ionization energy may be supplied through gas ports 270 placed near high power ceiling 240 mounted antennas 300, while gas ports 275 provide the a precursor gas with a low ionization energy, near low power sidewall 220 mounted antennas 300.

An advantage of being capable of supplying different precursor gases to areas of high, or low, power deposition is that it expands the types of precursor gases that may be used to form the plasma. As a result, the characteristics of the plasma may be improved to optimize workpiece processing. For example, He may be used in place of Ar as a source of ions. One advantage of He as compared to Ar is that He cations are less massive than Ar cations. The He cations, therefore, are more responsive to the applied workpiece bias. As a result, higher processing rates are possible without otherwise causing charge damage to the workpiece.

Yet another advantage of the preferred embodiment of the present invention is that the chamber need not be made of an insulative material. The portion of the chamber walls underlying the inductive coil antenna previously had to be made from a non-conductive material, typically quartz or ceramic, to prevent significant attenuation of the magnetic field generated by the external coil. With the coil inside the chamber this problem is no longer a consideration. Therefore, the chamber walls can be made of conductive materials, such as aluminum.

Making the chamber walls conductive has many desirable effects. First, as shown in FIGS. 3–5, the chamber walls 220 & 240 can be electrically grounded and serve as the electrical ground for the RF power supplied through the pedestal 16. The surface area of the chamber walls 220 & 240 is significantly greater than previously employed grounded areas. In addition, the surface area of the now conductive and grounded chamber walls 220 & 240 will greatly exceed that of the RF energized pedestal 16. This will create a larger negative bias voltage, thereby making it feasible to produce a more optimum plasma ion energy and directionality at the surface of the workpiece.

Although FIGS. 3–5 depict chamber walls that are formed of entirely conductive material and grounded, a portion of the walls may be formed of non-conductive material if as desired, or the walls may be set at some other voltage potential, or may be floating if desired. An advantage of the present invention, as discussed above, is that limitations on size and placement of non-conductive chamber wall material imposed by an external inductive antenna is removed.

Another advantage of employing conductive chamber walls is that it solves the problem of voltage shift that occurred when the conductive deposits on dielectric walls electrically couple with the grounded areas of the chamber. Since the chamber walls 220 & 240 are already conductive and electrically grounded, the deposition of additional conductive material on the interior surface of the walls is irrelevant and has no effect on the bias voltage or the plasma characteristics.

Yet another advantage of employing conductive chamber walls 220 & 240 is the enhanced cooling capability such walls can afford. For example, chamber walls made of aluminum exhibit a much higher thermal conductivity in comparison to the quartz walls of conventional inductively coupled plasma etch reactors (e.g. 204 W/mK for aluminum compared with 0.8 W/mK for quartz). In addition, as cooling channels 216 (shown in FIGS. 7A–8B) are easily formed in aluminum chamber walls 212 and the entire chamber can now be made of aluminum, cooling channels 216 can be distributed throughout the chamber walls. This eliminates the need for air cooling the exterior of the chamber walls as was necessary with a conventional inductively coupled RF plasma reactor. Flowing coolant through internal cooling channels 212 is a much more efficient method of heat transfer. Consequently, heat transfer from the chamber 400 to coolant fluid flowing in the cooling channels 216 formed in the chamber walls 212 is much quicker. This increased rate of heat transfer allows for much less variation in the chamber temperature. As a result, the chamber temperature can be readily maintained within that narrow range necessary to ensure efficient etch processing and to prevent the cracking and flaking off of contaminating deposits from the chamber walls.

Conductive chamber walls made of metals such as aluminum can, however, have a potential drawback. These materials would tend to sputter under some processing conditions. The material sputtered off of the walls could contaminate the workpiece and damage the devices being formed thereon. This potential problem is prevented by forming a protective coating 45 over the interior surface of the chamber walls, as shown in FIG. 5. This coating 45 is designed to be resistant to the effects of the plasma and so prevents the conductive material from being sputtered into the chamber 200. Further, the coating 45 is designed to have an insignificant effect on the electrical and thermal properties exhibited by the walls. If the chamber walls are aluminum, it is preferred the interior surface be anodized (i.e. coated with a layer of aluminum oxide). The anodized aluminum layer will provide the protective characteristics discussed above. Alternatively, a conductive ceramic material could be chosen to form, or to coat, the interior walls of the chamber to prevent sputtering and surface reaction on the walls. For example, boron carbide would be an appropriate choice.

A similar sputtering problem exists with the small coil antennas described previously. If the coil antennas were formed of a metal, the unwanted sputtering of this metal by the plasma could contaminate the workpiece, and would quickly erode the coil structure. To inhibit this, one embodiment has the coils constructed of a non-sputtering conductive material, such as a conductive ceramic like boron carbide. In another embodiment, the coil antennas may be formed with a metal core isolated from the plasma by non-sputtering material.

Figure 7A:
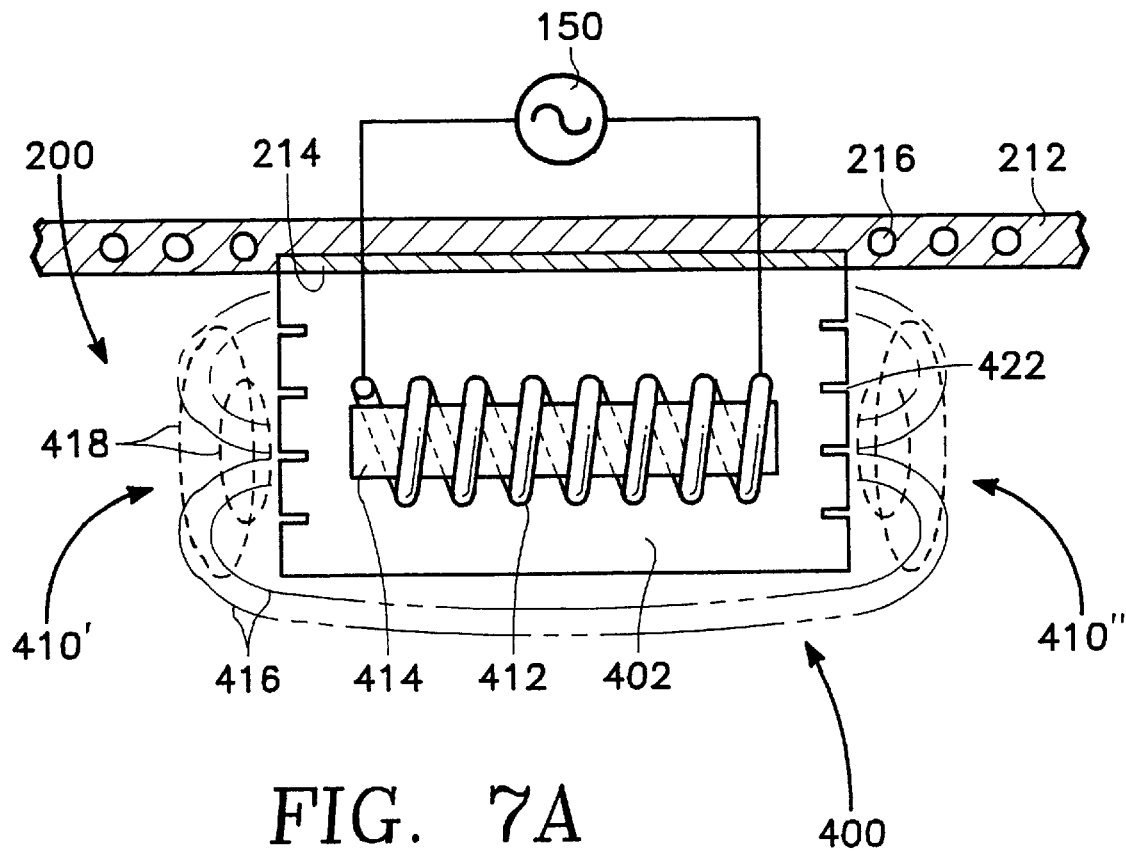
FIG. 7A is a partial cut away side view of an embodiment of a small internal inductive antenna of the present invention.

In one such embodiment, as depicted in FIG. 7A, a metallic coil 412 may be surrounded by a non-sputtering jacket 402. It is preferred that the non-sputtering jacket 402 also be a poor electrical conductor and a good thermal conductor, such as a ceramic such as aluminum nitride. The small antenna 400 may be coupled to the wall 212 of the chamber to form a heat exchange channel or conduit 214, which provides a heat flow path between the antenna 400 and the wall 212. In one embodiment, the heat exchange conduit 214 is created by directly coupling the antenna 400 to the wall 212, such as by brazing the antenna 400 to the wall 212 so that heat generated by the antenna 400 is transferred to the chamber wall 212 by conduction. The antenna 400 could also be interlocked with or be otherwise bonded with the wall, such as by screwing, gluing, fusing, or the like, to form the heat exchange conduit.

Coupling the antenna 400 to the wall 212 allows the temperature of the antenna 400 to be regulated by regulating the temperature of the wall 212. Therefore, the temperature of the antenna 100 may be regulated by pumping coolant through channels 216 in the reactor wall 212. Coupling the antenna 400 to the wall 212 so that it conducts heat to the wall 212 and regulating the temperature of the wall 212 provides a means for regulating the temperature of the antenna 400.

Regulating the temperature of the antenna 400 helps prevent cracking and flaking of the jacket 402 and inhibits cracking and flaking of any contaminating deposits that may accumulate on the surface of the antenna 400. Cracking and flaking are typically caused by thermal expansion cycles. For example, an unregulated antenna can reach temperatures of 500 degrees centigrade or more and then cool to room temperature. This type of temperature cycle can cause any coating or build-up on the surface of the antenna, or the jacket itself, to crack or flake. If the antenna is located over or near the workpiece, pieces likely will contaminate the workpiece if the temperature is not regulated. Furthermore, the jacket and conductor are less likely to separate if the temperature of the antenna is regulated. The optimum operating temperature of the antenna is dependent on the type of by-product and the composition of the antenna. It easily can be determined empirically and is expected to be about from 100 to 300 degrees centigrade.

With this embodiment, a good thermal conductor is selected that will transfer heat rapidly so that the antenna 400 does not heat unevenly. Uneven heating can cause thermal stresses on the antenna 100 which reduce its reliability. As current passes through the conductor coil 412, heat is generated by the conductor which heats the antenna 400. Since the antenna is cooled by the wall 212, a temperature gradient may build within the antenna 400. By using a good thermal conductor, the temperature gradient within the antenna can be reduced so that the antenna is not subject to thermal stresses sufficient to degrade the antenna 400 or degrade the antenna to wall coupling 214. Furthermore, the thermal conductivity of the antenna must permit the temperature of the antenna to be optimized, as discussed above, so that the antenna or by-products do not flake, and so that deposition of by-products on the surface of the antenna can be controlled.

Forming the jacket of a poor electrical conductor provides a means for coupling the conductor coil 412 to the electrically conductive chamber wall 212 without providing a path to ground through the grounded chamber wall 212. If the non-sputtering jacket 402 is formed of an electrically conductive ceramic material, such as boron carbide, the jacket 402 could be coupled to the wall 212 via an electrically insulative layer (not shown) formed between the electrically conductive jacket 402 material and the electrically conductive chamber wall 212. The thermally conductive layer thus provides the heat exchange conduit formed by the antenna to chamber wall coupling and thereby provides a means for regulating the temperature of the inductive antenna by regulating the temperature of the chamber wall.

FIG. 7A illustrates a possible embodiment of the small internal inductive antenna 400 of the present invention. In the embodiment of FIG. 7A, the jacket 402 is formed in the shape of a block with a conductive coil 412 disposed within the jacket 402. The coil 412 may be wound around a ferrous core 414, as shown in FIG. 7A, to improve magnetic flux properties. The coil 412 may be directly connected to an RF power supply, as shown in FIG. 7A, or may be interconnected to an RF power supply via other antennas.

The antenna 400 may be coupled to the chamber wall 212 by a brazing 214. The brazing bond 214 allows heat to exchange between the antenna 400 and the wall 212. In this embodiment, the temperature of the jacket 402 and of the conductor 412 is regulated by pumping coolant through channels 214 in the wall 212. Bonding the antenna 400 to the wall 212 by brazing is but one way to form the heat exchange conduit between the antenna and the wall. In the embodiment of FIG. 7A, the heat exchange conduit 214 between the antenna 400 and the wall must have sufficient thermal conductivity to allow regulation of the temperature such that thermal expansion cycles of the antenna 400 do not cause cracking or flaking of the antenna 400 or cause decoupling of the antenna-to-wall coupling.

The embodiment of FIG. 7A also employs gaps 422 in surfaces of the antenna exposed to the interior of the chamber 200. Separating the exposed surfaces of the antenna reduces eddy currents that can form in conductive deposits (not shown) that form on the surface of the antenna.

Eddy currents in the conductive by-product on the surface of the antenna 400, attenuate the power coupling between the antenna 400 and the plasma. Therefore, as a workpiece is processed, the power delivered to the plasma gradually diminishes. This affects plasma characteristics such as density and plasma etch rate. As workpiece processing necessitates precise control of plasma characteristics, variations in antenna power coupling degrades workpiece processing.

The eddy currents are induced by the electric field 418 associated with the changing magnetic field 416 generated by the RF power through the coil 412. The gaps 422 are formed so that they inhibit electrical connection of the conductive deposits between the surfaces separated by the gaps 422. Furthermore, the gaps 422 in the surface of the antenna 400 are oriented so that they inhibit eddy current flow in response to the electric and magnetic fields 416 & 418.

In the embodiment of FIG. 7A, the gaps are formed horizontally along the surface of the antenna adjacent the pole regions 410' and 410". With the small internal antenna 400, the pole regions 410' & 410" are areas of high power deposition. As such, it is possible to form the gaps 422 only near the pole regions 410' & 410" to reduce most of the eddy current losses. Although not shown in FIG. 7A, it is possible to form the gaps in any surface where conductive deposits may form to further reduce eddy current losses.

Figure 7B:
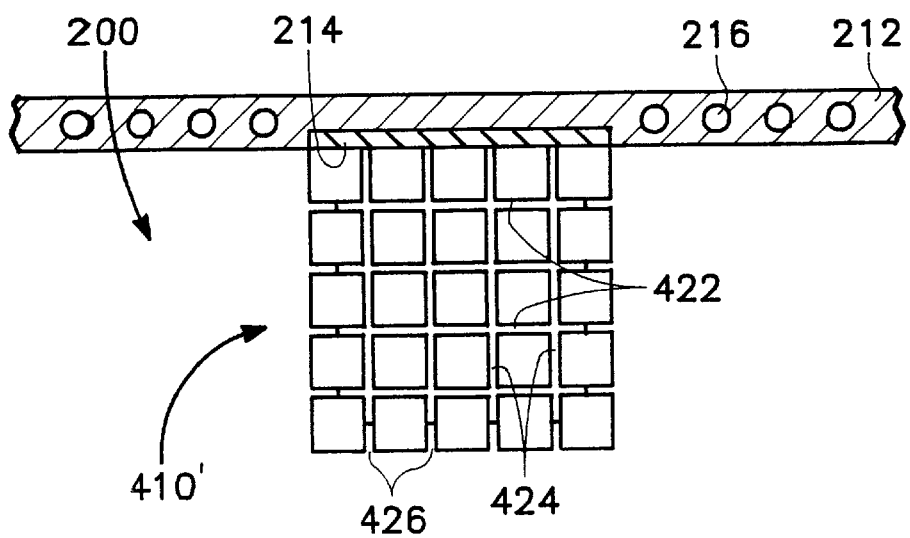
FIG. 7B is an end view of an embodiment of a small internal inductive antenna of the present invention.

FIG. 7B shows a side view of another embodiment of the present invention. In this embodiment, in addition to the horizontal gaps 422, vertical gaps 424 are provided along the surface of the antenna 400 near the pole region 410'. In addition, gaps 426 are also provided along the surface of the antenna in the non-pole regions of the antenna 400.

Separating or segmenting the surface of the antenna 400, inhibits eddy current flow. As such, separating the surface of the antenna 400 with gaps 422 provides a means for reducing eddy currents formed in conductive deposits on the surface of the antenna and for further improving inductive power coupling to the plasma.

Figure 8A:
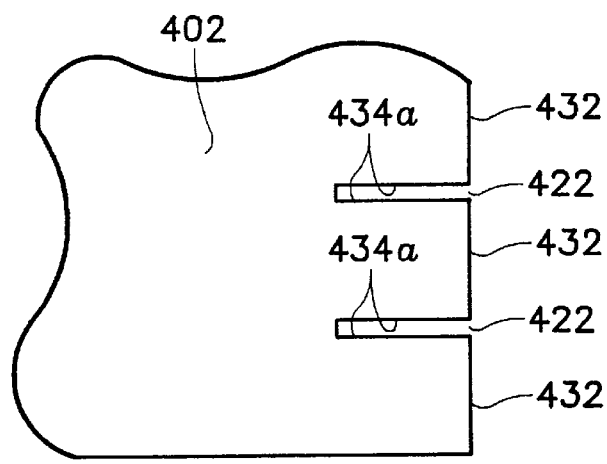
FIG. 8A is an exploded side view of an embodiment of a small internal inductive antenna of the present invention.
Figure 8B:
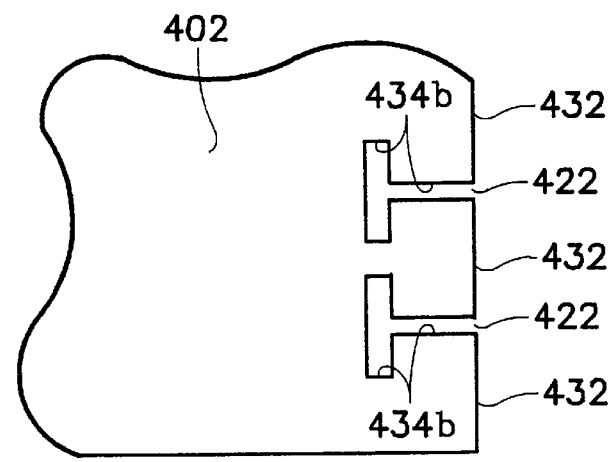
FIG. 8B is an exploded side view of an embodiment of a small internal inductive antenna of the present invention.

Turning to FIGS. 8A & 8B, in the preferred embodiments, the gap 422 size is large enough to inhibit conductive deposits from bridging the gap and electrically connecting surfaces separated by the gaps. Furthermore, in the preferred embodiments, the gap size is selected so that plasma is not generated between in the gaps 422. The maximum gap size, therefore, is governed by Debye's equation as follows:

$$\lambda_{De} = (\epsilon_0 T_e / e n_0)^{1/2}$$

where
$\lambda_{De}$ is the Debye length;
$\epsilon_0$ is the permittivity of free space, 8.854×10–12 F/m;
$T_e$ is the electron temperature≈4V;
e is the nonsigned charge of an electron;
$n_0$ is the plasma density.
In typical applications, the gap is formed having parallel side walls 434 extending below the exposed surface of the jacket 402, as shown in FIG. 8A, which are separated by a width of between about 0.025 mm to 1 mm.

To inhibit conductive deposits within the gap 422 from electrically joining the separated surfaces 432, the parallel side walls 434a typically have an aspect ratio larger than 5. In the embodiment of FIG. 8B, the jacket 402 may be formed so that the portion of the gap 422 extending below the surface 432 of the antenna forms a "T" shape to inhibit conductive byproduct from joining the segments. The length of the side walls 434a & 434b are sufficiently large as compared to the width of the gap 422 so as to inhibit conductive material deposited within the gap from joining the separated surfaces 432.

Figure 9A:
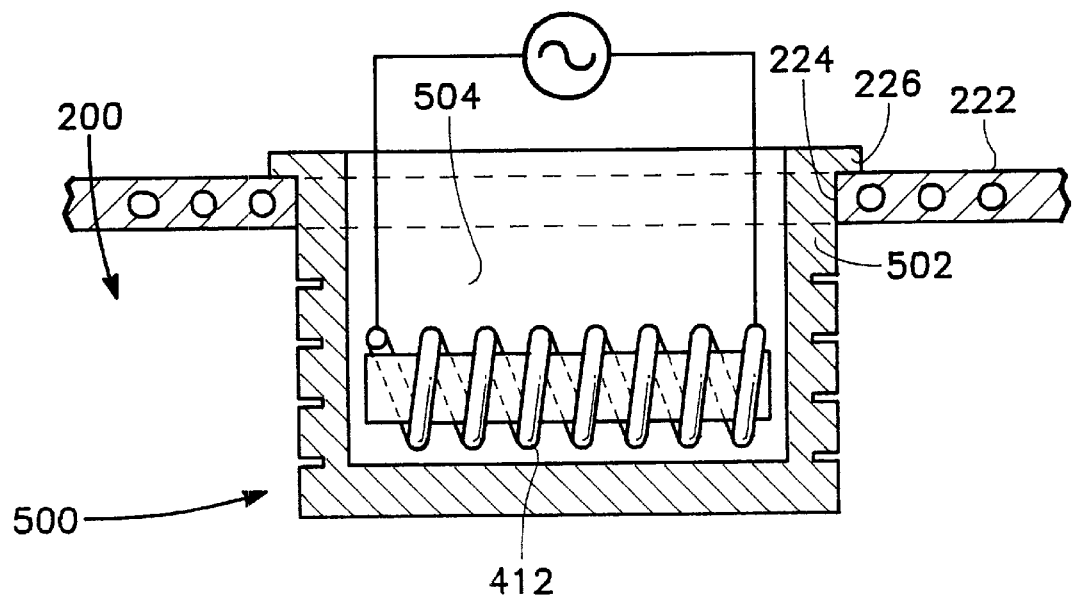
FIG. 9A is a partial cut away side view of an embodiment of a small internal inductive antenna of the present invention.

Turning to FIG. 9A, in yet another embodiment of the present invention, the coil 412 is partially surrounded by the jacket 502 such that it is located in an interior portion 504 of the antenna 500 formed by the jacket 502. With this embodiment, the antenna 500 is seated in the chamber wall 222, such as for example using a flange 226, threading, or other known mechanical interlock, so that heat may flow from the jacket 502 of the antenna 500 to the chamber wall 222 at the antenna 500 to wall 222 coupling 224. Thus, the temperature of the antenna 500 may be regulated by regulating the temperature of the chamber wall 222. In addition, in this embodiment, it also is possible to regulate the antenna 500 temperature by cooling the interior portion 504.

Figure 9B:
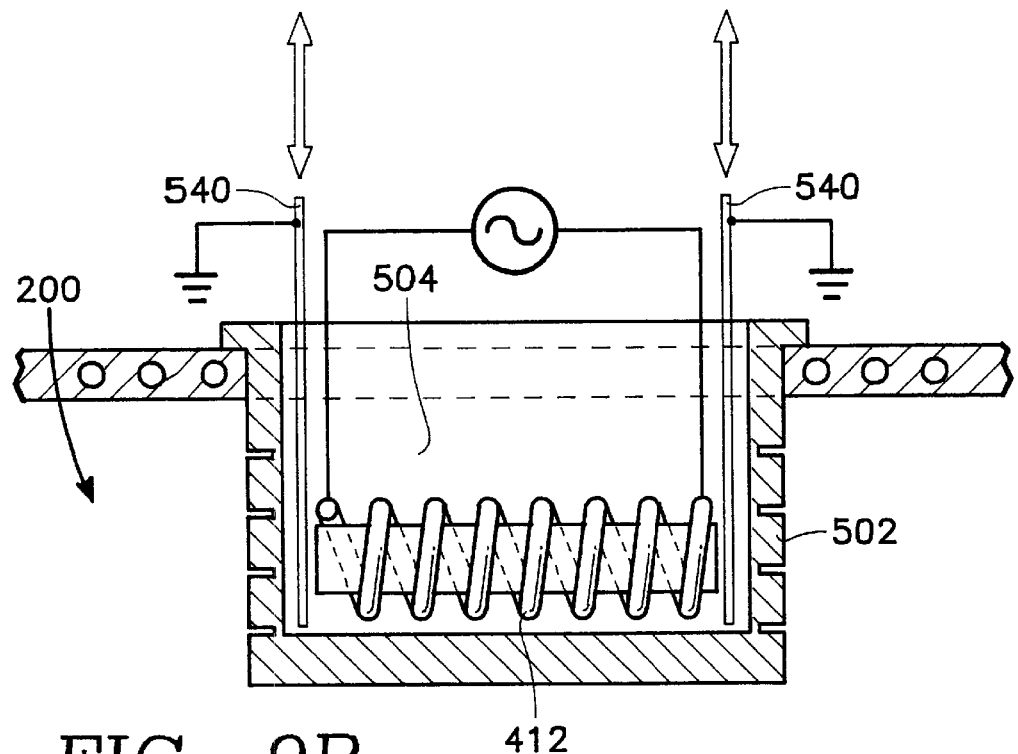
FIG. 9B is a partial cut away side view of an embodiment of a small internal inductive antenna of the present invention.

Turning to FIG. 9B, in this embodiment, shields 540 may be utilized to control the power profile outside the antenna. For example, the shields 540 may disposed part way, or all the way into the interior portion 504 to selectively reduce power deposition in the chamber 200. The shield may be located near the pole, or non-pole regions of the antenna 200.

Figure 9C:
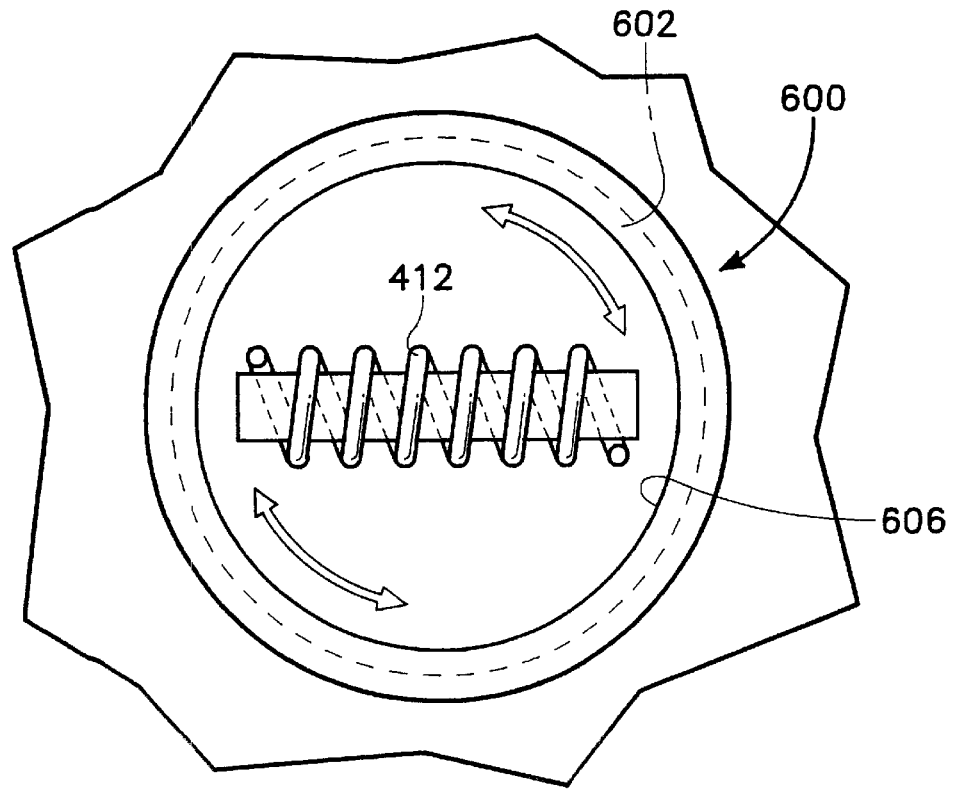
FIG. 9C is a partial cut away side view of an embodiment of a small internal inductive antenna of the present invention.

Turning to FIG. 9C, it is also possible to provide the jacket 602 with cylindrical side walls 606. In this embodiment, the coil 412 may be rotated, either by rotating the coil 412 and jacket 602 together, or by rotating the coil within the jacket 602 to change the power deposition within the chamber. As such, the orientation of the coil 412 may be adjusted to provide the optimum power deposition within the chamber. For example, the pole orientation of the antennas of FIGS. 2A–2C may be obtained by rotating the coils, either with respect to the jacket, or by rotation of the entire antenna 600.

The interior portion surrounding the coil and core of FIGS. 9A–9C may be formed totally or partially hollow, or may be solid, and may facilitate shielding, coil rotation, and/or coil cooling. In one embodiment, for example, a bell shaped glass jacket with a hollow interior prevents sputtering of the conductive coil, while allowing rotation, shielding, and temperature regulation of the antenna.

Figure 6B:
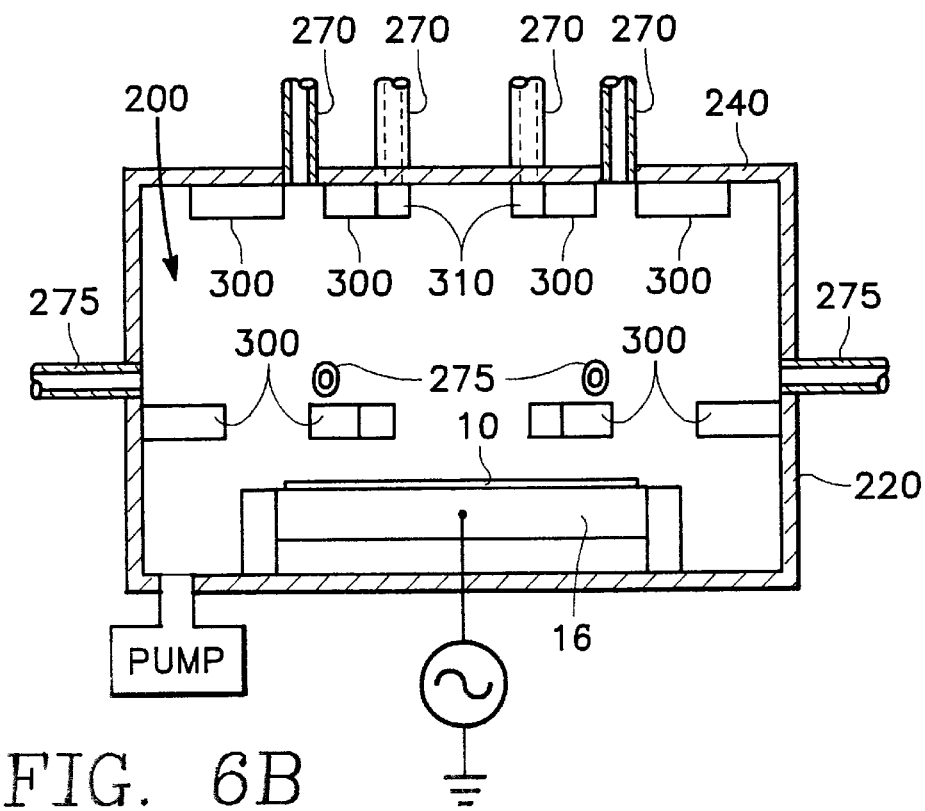
FIG. 6B is a cut away side view of the embodiment of FIG. 6A

As discussed above, by selectively locating the gas ports adjacent areas of high or low power deposition as shown in FIGS. 5–6B, it is possible in some embodiments of the present invention to better control the plasma characteristics and expand process gas selection, thus improving workpiece processing and costs. In addition, other embodiments of the present invention may allow process gas to be supplied through the center of selected coils. FIGS. 10A–10F depict possible embodiments of the small inductive coil antenna having the process gas port located within the coil.

Figure 10A:
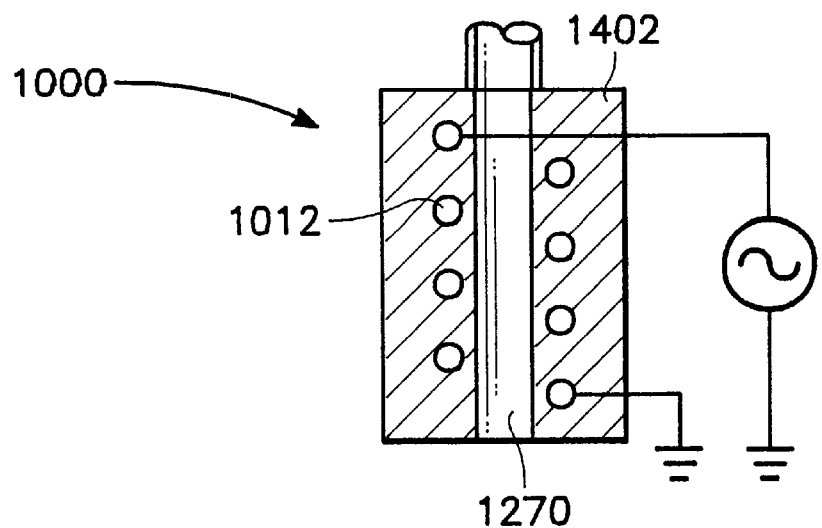
FIG. 10A is a cut away side view of a nozzle type embodiment of the small inductive antenna of the present invention employing a coil type inductive antenna.

Referring to FIG. 10A, the inductive coil 1012 surrounds the gas port 1270. In this embodiment, the diameter of the port 1270 is such that plasma does not form within the port 1270. The diameter of the port, therefore, is governed by the Debye length.

Also with this embodiment, the coil 1012 is embedded in a thermally conductive jacket 1402 and may be secured to a chamber wall so that heat generated by the coil is transferred to the chamber wall. Furthermore, the coil should be electrically insulated, either by providing a separate electrical insulator (not shown) around the coil 1012, or by forming the jacket 1402 of an electrically insulative material which does not significantly attenuate the inductive power supplied to the chamber. Furthermore, with this embodiment, it is preferred that the surface of the antenna exposed to plasma be formed of a non-sputtering material as discussed above. As such, in some applications, the jacket 1402 may be formed of a ceramic such as aluminum nitride or the like to prevent sputtering, and to provide thermal conductivity and electrical insulation.

Figure 10B:
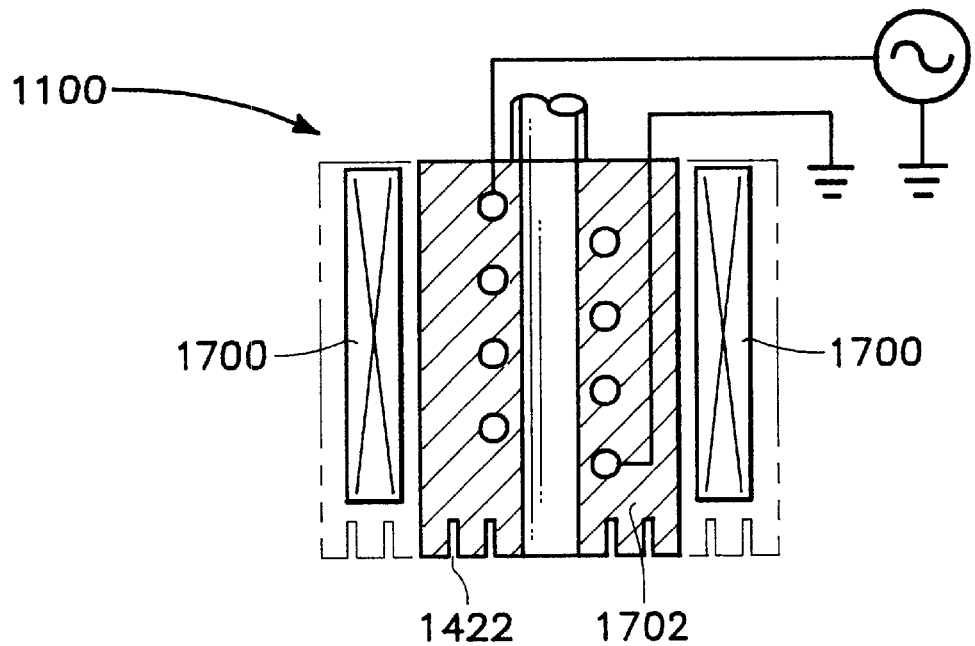
FIG. 10B is a cut away side view of a nozzle type embodiment of the small inductive antenna of the present invention employing a coil type inductive antenna.

Referring to FIG. 10B, gaps 1422 may be provided, as discussed above, in the surface of the antenna 1100 where thermally conductive material will deposit to reduce eddy currents in the conductive deposits. The gaps 1422 segment the exposed surface of the antenna 1100 to inhibit eddy currents from flowing in conductive deposits on the surface of the antenna 1100. In this embodiment, the gaps 1422 are formed adjacent the pole region and may extend linearly across the surface of the antenna, as shown in FIG. 10B, or may form arcuate segments in the surface of the antenna jacket 1702 as shown in FIG. 10E. It is also possible with this embodiment, to provide magnets 1700 adjacent some or all of the small antennas, if desired, to control plasma distribution within the chamber. The magnets 1700 may also be enclosed within the jacket material as indicated in phantom.

Figure 10C:
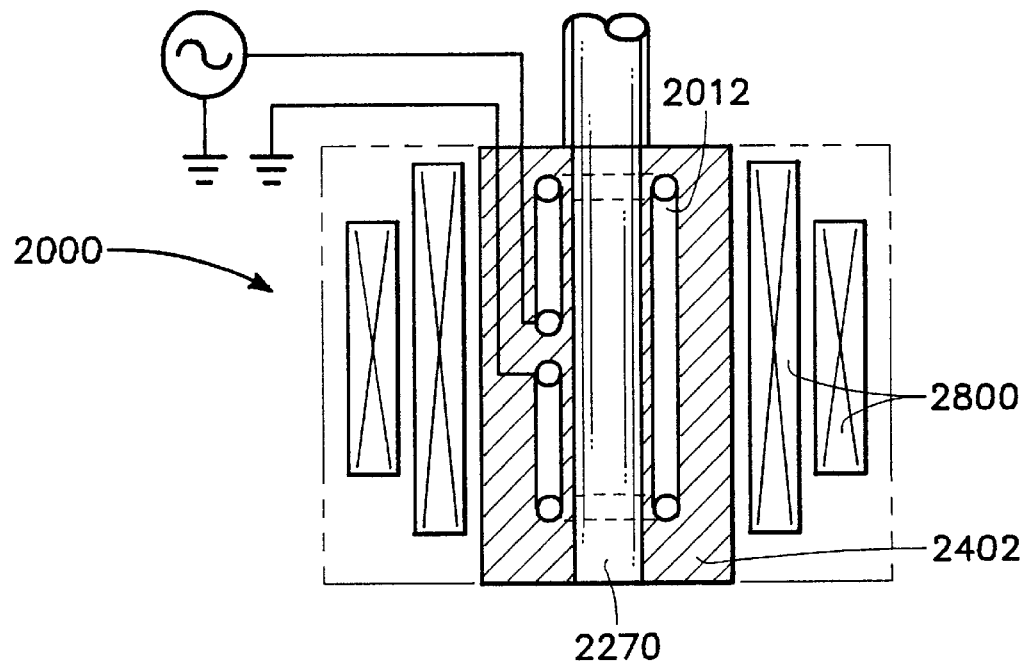
FIG. 10C is a cut away side view of a nozzle type embodiment of the small inductive antenna of the present invention employing a loop type helicon wave inductive antenna.

Referring to FIG. 10C, in another embodiment, the process gas may be delivered through a port 2270 located between the loop or loops of a small magnetically enhanced inductive antenna capable to generating a helicon wave. In this embodiment, a conductor 2012 is looped twice around the gas port 2270 such that RF currents in the two loops are 180 degrees out of phase so as to propagate the helicon wave. The distance between loops being such that the time taken for the induced helicon wave to propagate between the two loops is ½ of the RF period (about 12.5 cm for 13.56 MHZ).

The conductors 2012 are imbedded in a jacket 2402. As with the embodiments discussed above, the jacket preferably is formed of a non sputtering, electrically insulative, thermally conductive material.

The inner and outer electromagnets 2800 are located circumferentially around the outside of the conductor 2012 to enhance plasma generation and to control plasma distribution in the processing chamber. The current in the inner and outer magnets 2800 may be adjusted to provide a magnetic field which diverges rapidly outside the collateral chamber cylinder. An axial magnetic field in the port 2270 directs the plasma to the processing chamber where it diverges into the processing chamber. This divergence also serves to keep the magnetic field away from the workpiece. The interaction between the axial magnetic field and the induced RF electric field within the cylinder gives rise to the helicon wave. The helicon wave propagates according to the dispersion relation and in accordance with Landau damping into the processing chamber.

Some attributes and examples of helicon wave plasma generation devices are disclosed in U.S. Pat. Nos. 4,990,229 and 5,421,891 and 5,429,070, all by Campbell et al., all entitled HIGH DENSITY PLASMA DEPOSITION AND ETCHING APPARATUS, issued Feb. 5, 1991 and Jun. 6, 1995 and Jul. 4, 1995 respectively, all herein incorporated by reference in their entireties.

The helicon wave antenna is not limited to the above described layout to produce an m=0 helicon wave. For example, a single loop antenna may also be utilized to produce a helicon wave. Also, other antenna configurations may be employed to generate other modes of helicon waves, such as m=1, to form the plasma.

Figure 10D:
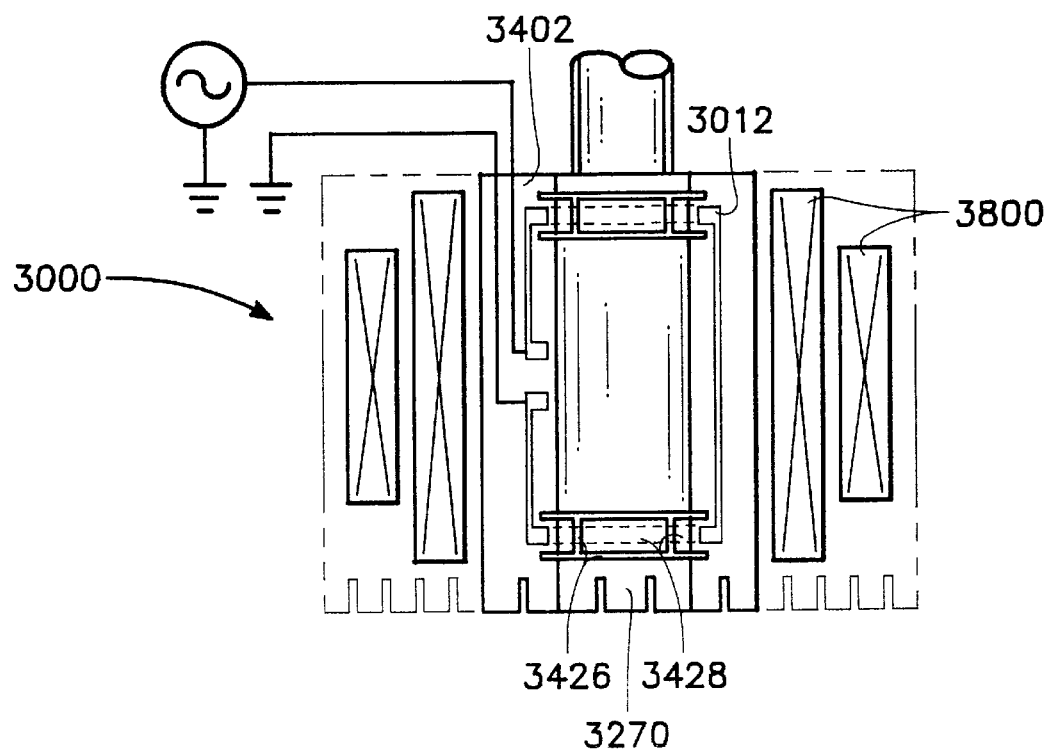
FIG. 10D is a cut away side view of a nozzle type embodiment of the small inductive antenna of the present invention employing a loop type helicon wave inductive antenna.
Figure 10E:
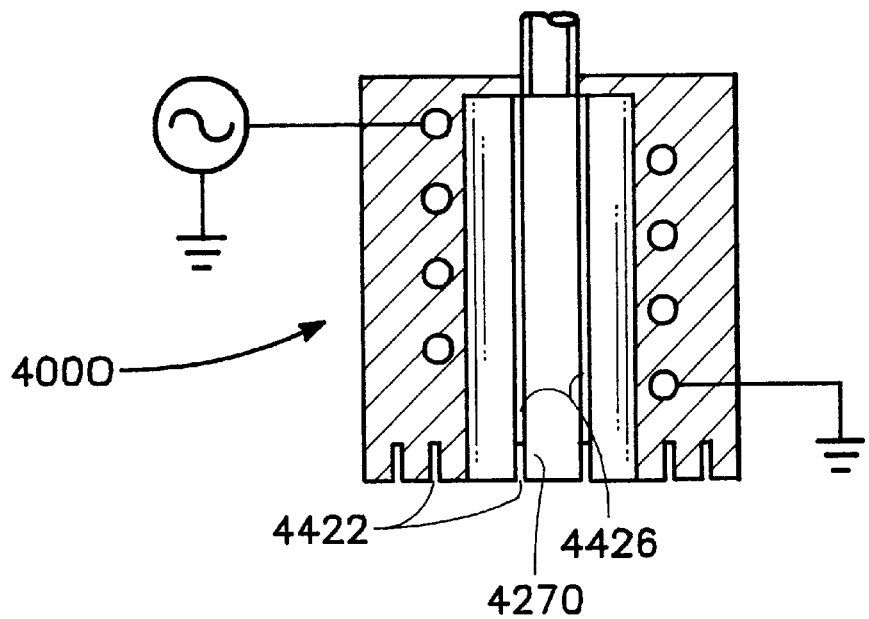
FIG. 10E is a cut away side view of a nozzle type embodiment of the small inductive antenna of the present invention employing a coil type antenna.

With the embodiment of FIG. 10C, the diameter of the port 2270 is selected so that no plasma is generated within the port 2270. In the embodiment of FIG. 10D, however, the port 3270 is formed so that plasma forms within the port 3270. In the embodiment of FIG. 10D, the conductor 3012 is embedded in a jacket 3402, as discussed above. As the interior of the port is exposed to conductive deposits, the interior surface of the port 3270 is segmented to inhibit induced eddy currents in accumulated conductive deposits from reducing power coupling to the plasma. The entire interior may be segmented, or only the portions adjacent areas of high power deposition. In FIG. 10D, gaps 3426 segment portions 3428 so that eddy currents are inhibited from flowing around the interior of the port near the antenna loops.

As with the embodiments of FIG. 10C, the magnets 3800 are disposed around the port 3270 to create an axial magnetic field within the port to facilitate helicon wave generation and plasma distribution outside the port 3270. The magnets 3800 may be enclosed within the jacket 3402 as shown in phantom.

An advantage of an antenna capable of generating a helicon wave it that it provides efficient coupling of source power and it may operate over a wide range of RF source power (0.5–3.0 kW), magnetic field strength (30–300 G), and pressures (0.5–50 mT). Another advantage of the helicon wave antenna is that by adjusting plasma parameters, the helicon wave antenna may provide ionization rates approaching 100%. The uniform nature of plasma generated by helicon wave in a magnetic field, allows the plasma to flow into the processing chamber to produce a more uniform processing plasma.

Referring to FIG. 10E, it also is possible to allow plasma to form within the port 4270 passing through the center of the small coil antenna 4000. In such an embodiment, the interior walls of the port 4270 is separated into segments by gaps 4426 to inhibit conductive deposits from forming in conductive deposits. In addition, gaps 4422 may separate a portion, or all, of the exterior surface of the antenna 4000.

Figure 10F:
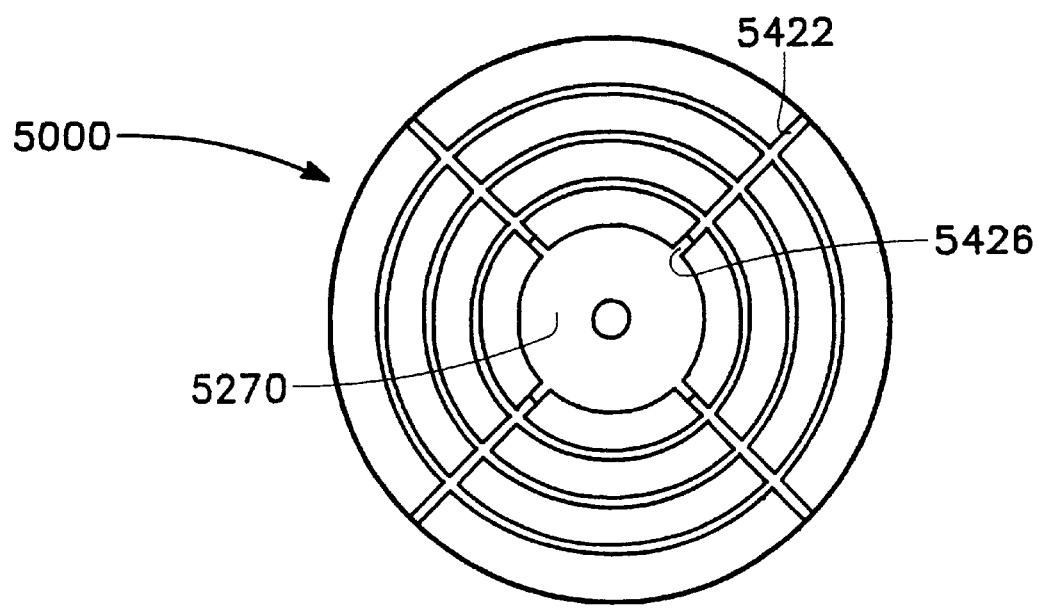
FIG. 10F is an end view of the nozzle type embodiment of the small inductive antenna of FIG. 10E.

FIG. 10F shows the bottom view of yet another possible embodiment. In this embodiment, the exterior bottom surface of a cylindrical antenna 5000 is separated into arcuate segments by gaps 5422 to inhibit eddy current flow around the bottom of the antenna 5000 adjacent the pole region of the antenna. Also in the embodiment of FIG. 10F, gaps 5426 are located in the interior surface of the port 5270 to inhibit contiguous build-up of conductive deposits on the interior surface of the port 5270.

Regardless of the orientation of the conductor within the jacket, the exterior sides of the antenna exposed to the processing chamber may be segmented so as to inhibit contiguous joining of accumulated conductive deposits on the exterior sides. When adjacent chamber walls are employed as the cathode for the applied capacitive bias, such an embodiment can inhibit conductive deposits from electrical joining to the chamber walls and significantly altering the cathode area during workpiece processing.

As discussed above, it is presently preferred to form the antenna of a conductive material surrounded by an electrically insulative, thermally conductive, non-sputtering jacket. In other embodiments of the present invention, a conductive material may be surrounded by an electrically insulative jacket that is surrounded by a non-sputtering, thermally conductive jacket. In yet another embodiment, the electrical conductor may be surrounded by an electrically insulative, thermally conductive jacket with a non-sputtering jacket completely or partially surrounding the electrical insulative jacket to prevent sputtering of the exposed surface of the antenna and to facilitate temperature regulation of the antenna.

Furthermore, as discussed above, the internal inductive antenna may be removably, or fixedly, secured within the processing chamber, such as by seating, screwing, fusing, or otherwise interlocking with or bonding to the chamber wall. In the preferred embodiments, the antenna is coupled to the wall so that heat may exchange between the antenna and the chamber wall to facilitate temperature regulation of the antennas. It also is possible to secure the antennas to a support member which may be coupled to the chamber wall.

An advantage of the embodiments of FIGS. 10A–10F is that it provides more concentrated application of source power to the precursor gas. In addition, the individual antennas may be utilized to control the density of plasma species. Furthermore, the individual antenna may be utilized to improve processing by expanding process gas selection. In such an embodiment, a gas with a high ionization energy could be supplied into a high power antenna, while a gas with lower ionization energy could be introduced through a lower power antenna. For example, in the embodiment of FIG. 11, a precursor gas with high ionization energy may be supplied through high power antenna 6000 secured to the top wall 6240, while a precursor gas with low ionization energy may be supplied through low power antennas 6100 secured to the side wall 6220. As a result, the characteristics of the plasma may be improved to optimize workpiece processing.

Figure 11:
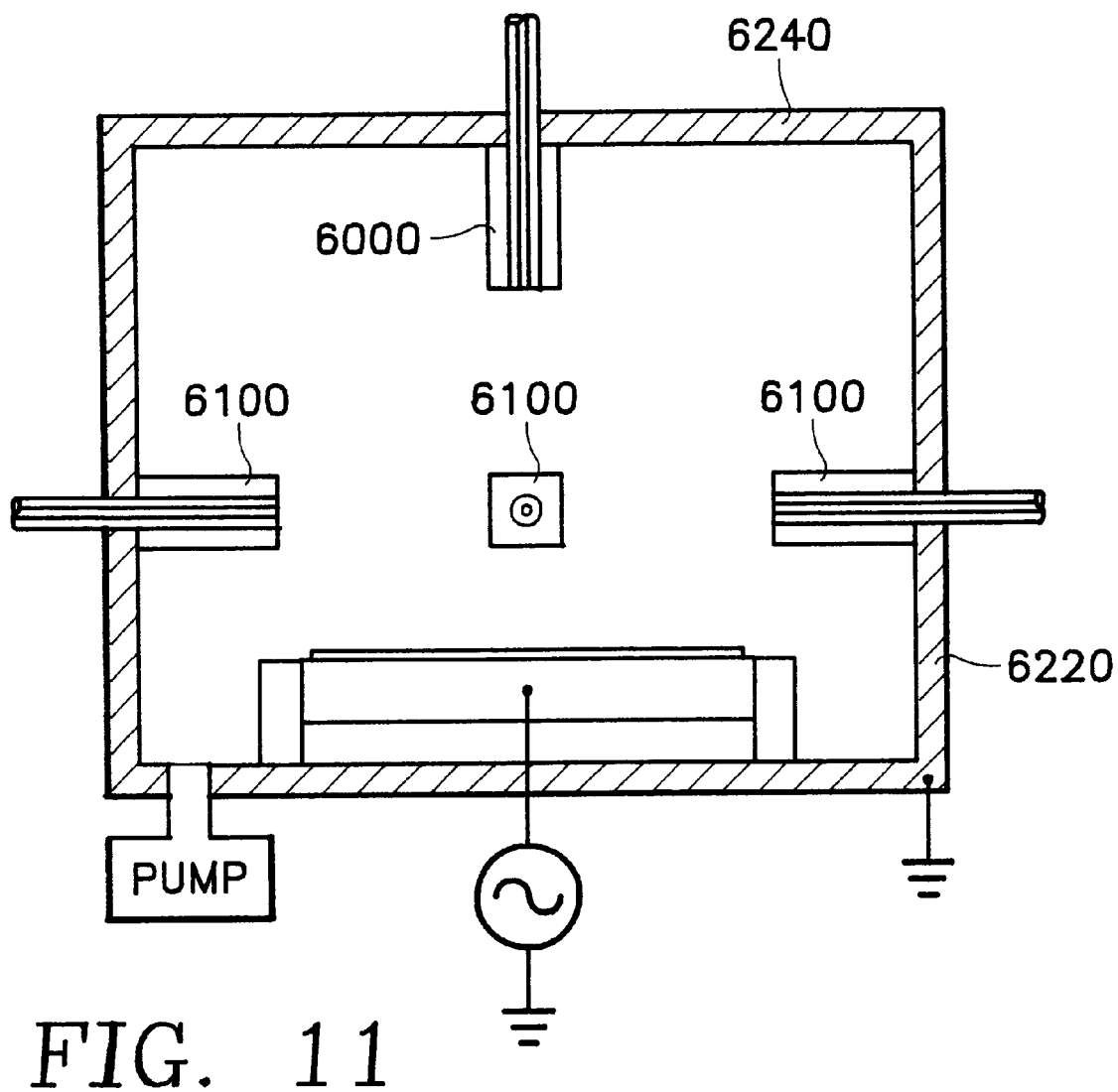
FIG. 11 is a cut away side of an embodiment of a plasma reactor of the present invention employing the nozzle type small inductive antennas.

In the FIG. 11, the antennas 6000 & 6100 and gas ports therethrough form nozzles extend into the processing chamber. The nozzles formed by antennas 6000 & 6100 and gas ports may be secured to the chamber wall 6220 by mechanically interlock with the walls 6220 & 6240, or by bonding with the walls 6220 & 6240. As such, the nozzles may be secured to the chamber wall 6220 & 6240 such that they extend from the wall 6220 & 6240 as shown in FIG. 11, or be recessed within the wall 6220 & 6240. It also is possible to secure the nozzles flush with the chamber wall if desired. Furthermore, in some embodiments it is possible to provide adjustable nozzles so that the position of the nozzles may be adjusted to control plasma characteristics at the workpiece.

As discussed above, the small internal inductive antennas of the present invention may be disposed in any configuration within the processing chamber to provide the desired plasma characteristics at the workpiece. In addition, any number or size of small inductive antennas may be placed within the processing chamber. Some embodiments may employ varying sizes of small antennas, while other embodiments may utilize the small inductive antenna of the present invention in conjunction with existing chamber and antenna layouts to improve processing.

In addition to the advantages described thus far, embodiments of the present invention employing electrically conductive chamber walls allow the reactor to be operated in a capacitively coupled mode, in an inductively coupled mode, or any combination thereof. If RF power may be supplied to the pedestal, without also supplying RF power the inductive antennas, the reactor will operate in a capacitively coupled mode. This is not possible in a conventional inductively coupled plasma etch reactor due to the previously-described inadequate area ratio between the pedestal and the conductive anode portion. The area ratios typically found in conventional inductive reactors produce poor capacitive power coupling which has been found insufficient to generate a plasma within the chamber. Alternatively, RF power could be supplied to the inductive antennas without also supplying RF power the pedestal. Thus, the reactor would operate in an inductively coupled mode.

Inductive coupling will be more efficient at pressures ranging between about 1 mTorr and 100 mTorr, while capacitive coupling will be more efficient at pressures ranging between about 100 mTorr and 10 Torr. Some processes are best performed at lower pressures consistent with inductive coupling, whereas other etch processes are best performed at the higher pressures consistent with capacitive coupling. Thus, some embodiments of the reactor constructed in accordance with the present invention have a greater versatility than either a conventional inductively coupled or capacitively coupled plasma etch reactor because it can support processing over much wider pressure ranges.

Additionally, inductive coupling will generate more ions, while capacitive coupling will produce more reactive neutral species. Different processes or process steps often call for more ions or more reactive neutral species, depending on the desired result. A reactor constructed according embodiments of the present invention can control the composition of the plasma in ways not possible with conventional inductively coupled or capacitively coupled etch reactors because the amount of RF power inductive and capacitive coupled into the chamber can be readily varied by varying the amount of power supplied to the pedestal and to the collective or individual internal inductive antennas. For example, some steps of an etch process can be performed with more inductive coupling to create an ion-rich plasma, while other steps can be performed with more capacitive coupling to create a reactive neutrals-rich plasma.

Furthermore, in addition to controlling the plasma characteristics by controlling the power deposition of the individual antennas, the inductive antennas need not be the only source employed to sustain the plasma. Rather, the plasma can be at least partially sustained via capacitive coupling using the energized pedestal. This allows the RF power supplied to the antennas to be tailored to produce the desired species concentrations without regard to the power necessary to sustain the plasma.

Figure 12:
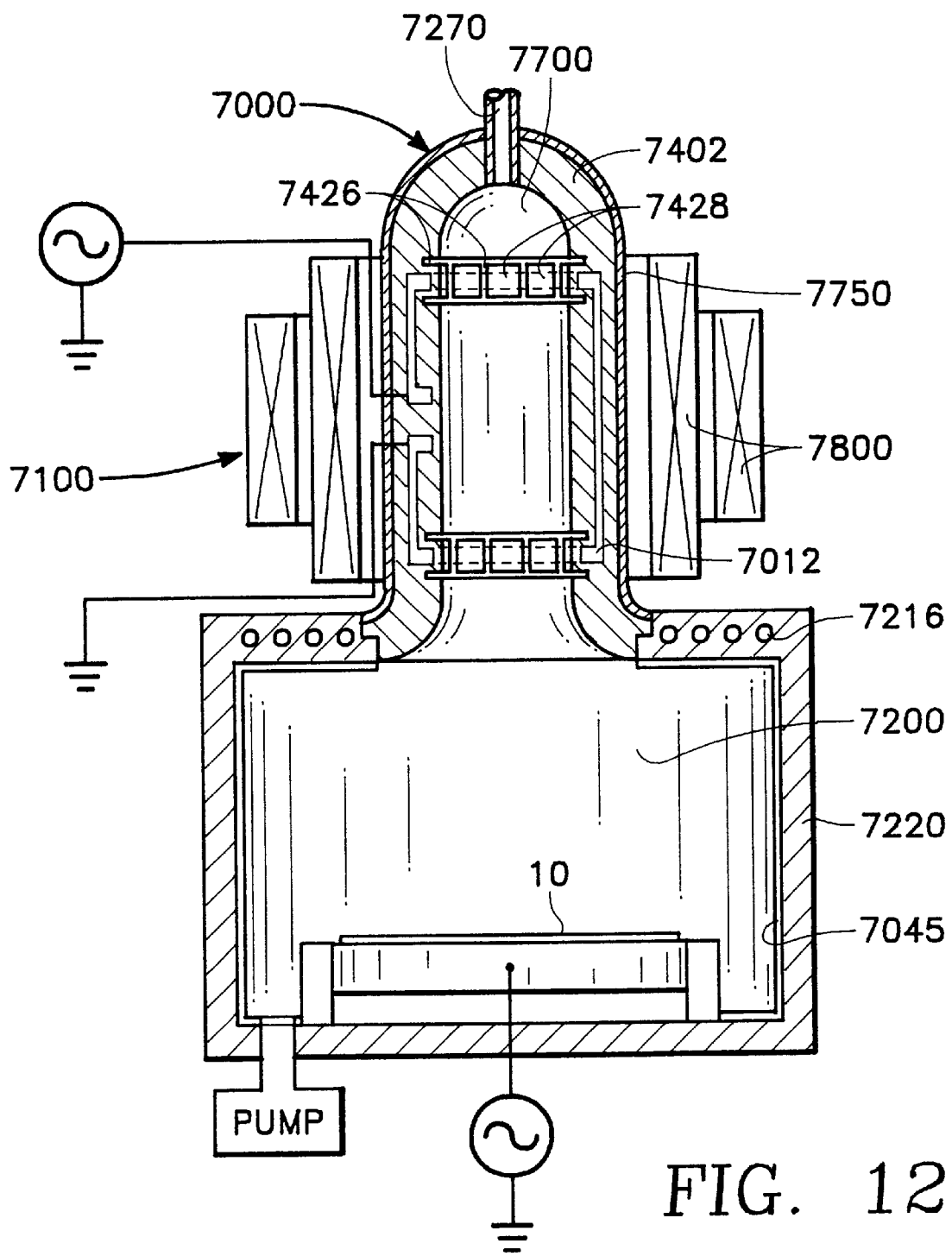
FIG. 12 is a cut away side view of an embodiment of a plasma reactor with an internal inductive antenna capable of generating a helicon wave.

FIG. 12, illustrates an improved helicon source plasma reactor 7000. A chamber 7200 is adapted to hold a workpiece 10 therein. A portion of the chamber 7700 is adapted to contain an inductively coupled antenna 7000 of a magnetically enhanced inductively coupled source power applicator 7100. Plasma is generated within the chamber 7200 from process gas for processing the workpiece 10. The process gas may be introduced into through a gas inlet port 7270 located near or through the antenna 7000.

The source power applicator 7100 of FIG. 12 is capable of generating a helicon wave to generate plasma. In a conventional reactor capable of generating a helicon wave, a double loop antenna is disposed around the outside of the cylinder of a bell shaped portion of the chamber. With the embodiment of FIG. 12, however, the antenna 7000 is provided within the bell shaped portion 7750 of the chamber 7200.

With the internal inductive antenna of FIG. 12, a jacket 7402 surrounds a conductor 7012 to prevent sputtering of the conductor 7012. The jacket 7402 may be formed of a ceramic material, as discussed above, to prevent sputtering and to electrically insulate the conductor 7012.

It is presently preferred that the jacket 7402 have a segmented surface 7428 to inhibit eddy currents in conductive deposits on the exposed surface of the antenna 7000. The jacket 7402 may be segmented by gaps 7426 which inhibit conductive deposits from electrically joining the segments, as discussed above.

With the loop antenna, the entire interior of the bell shaped portion of the chamber may be segmented into circumferential rings and/or arcuate segments, or only the portions adjacent the antenna conductor.

The walls 7220 of the chamber 7200 may be constructed of electrically and thermally conductive material, such as aluminum, or the like, and the voltage potential of the walls may be controlled, such as by fixing the potential at ground. The exposed chamber walls 7220 may have a coat 7045, as discussed above, to inhibit sputtering of the chamber walls. It is possible in some embodiments to form the wall 7750 of the bell portion of the chamber 7200 of glass or the like.

Preferably, the temperature of the antenna is regulated to prevent cracking and flaking of the jacket and deposits. Cooling channels 7216 in the chamber 7200 walls may be provided for temperature regulation. Thus, in some embodiments, the temperature of the antenna may be regulated by regulating the temperature of the chamber walls 7750 & 7220.

As discussed above, using a helicon wave to generate the plasma allows a uniform high density plasma to be generated over a large range of temperatures and pressures. This allows a large process window for both etching and deposition processes. Some attributes and examples of helicon wave plasma generation devices are disclosed in U.S. Pat. Nos. 4,990,229 and 5,421,891 and 5,429,070, all by Campbell et al., all entitled HIGH DENSITY PLASMA DEPOSITION AND ETCHING APPARATUS, issued Feb. 5, 1991 and Jun. 6, 1995 and Jul. 4, 1995 respectively, all incorporated by reference in their entirety.

To generate a helicon wave, the antenna 7012 is supplied with current by an RF source generator so that the current in one loop passes in a clockwise manner while the current in the other loop passes in a counterclockwise manner to produce currents 180 degrees out of phase so as to create an m=0 helicon wave within the bell chamber. Although not shown, other antenna configurations as is known in the art, such as for example a single loop antenna, may be utilized to induce an m=0 helicon wave. Furthermore, other modes of helicon waves, such as m=1, may be used to generate the plasma. The bell chamber may have a diameter of 10 cm with the optimum distance between loops being such that the time taken for the induced helicon wave to propagate between the two loops is ½ of the RF period (about 12.5 cm for 13.56 MHZ).

With the embodiment of FIG. 12, the chamber power applicator also includes nested electromagnets 7800 which provide an axial magnetic field within bell portion 7700 of chamber 7200. The interaction between the axial magnetic field and the induced RF electric field within the bell portion 7700 of the chamber 7200 gives rise to the helicon wave which forms the plasma.

The current in the inner and outer magnets 7800 may be adjusted to provide a magnetic field which diverges rapidly outside the bell portion 7700. The axial magnetic field in the bell portion 7700, typically in the range of about 30 to 300 Gauss, directs the plasma toward the workpiece where it diverges to provide plasma uniformity near the workpiece 10. The divergence also serves to keep the magnetic field away from the workpiece 10. It also is possible, if desired, to form a magnetic bucket around the chamber to inhibit sputtering of the chamber walls and to control plasma density within the chamber, as is known in the art.

The magnetically enhanced source power applicator of the present invention allows the present invention to be operated over a wide range of RF source power (0.5–3.0 kW), magnetic field strength (30–300 G), and pressures (0.5–50 mT), thereby expanding the processing window. Another advantage of the helicon wave antenna is that the helicon wave antenna may provide ionization rates approaching 100%. The uniform nature of plasma generated by helicon wave in a magnetic field, allows the plasma to produce a more uniform processing plasma.

Figure 13:
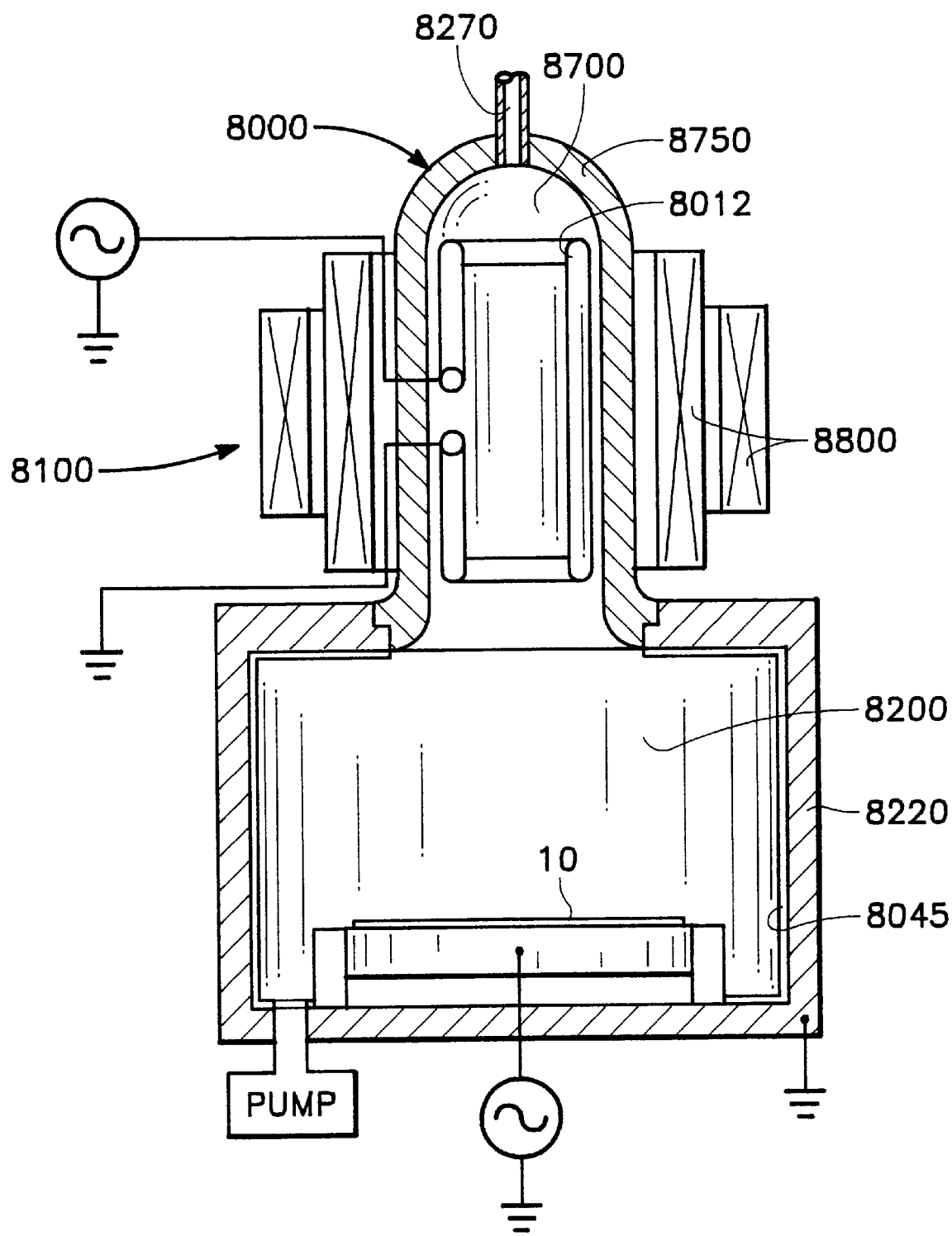
FIG. 13 is a cut away side view of an embodiment of a plasma reactor with an internal inductive antenna capable of generating a helicon wave.

Turning to FIG. 13, it also is possible to secure the inductive antenna 8000 of the helicon source power applicator 8100 within the wall 8750 of the bell portion 8700 of the chamber 8200. This also places the antenna 8000 beyond any conductive deposit coating of the chamber. Thus, the conductive coating on the interior walls cannot attenuate the magnetic field generated by the energized antenna, and so there is no decrease in the inductive coupling of RF power to this region. As a result, there is no detrimental effect on the plasma characteristics within the chamber. Of course, since the antenna is energized during processing, there will be no deposition of material thereon which could interfere with the inductive coupling of power. Further, since the antenna 8000 is immersed in plasma inside of the chamber 8700 it can generate a plasma using a lower level of RF power because the impedance of the chamber walls need not be overcome as is the case with a conventional inductively coupled plasma etch reactor.

With the embodiment of FIG. 13, the antenna 8000 my be formed of a "non-sputtering" conductive material, such as a conductive ceramic like boron carbide. Another possibility would be to use a metal core surrounded by a "non-sputtering" coating. For example, an aluminum core covered with a boron carbide jacket. In either embodiment, the antenna 8000 would be protected from the sputtering effects of the plasma and any contamination of the workpiece 10 prevented.

It is also noted that the temperature of the antenna 8000 during processing must often be controlled. If such is the case, the antenna 8000 can be constructed with a hollow, tube-like structure. This would allow coolant fluid to be pumped through the channel formed by the interior of the antenna 8000 to regulate temperature of the antenna 8000 and maintaining the desired operating temperature.

Figure 14:
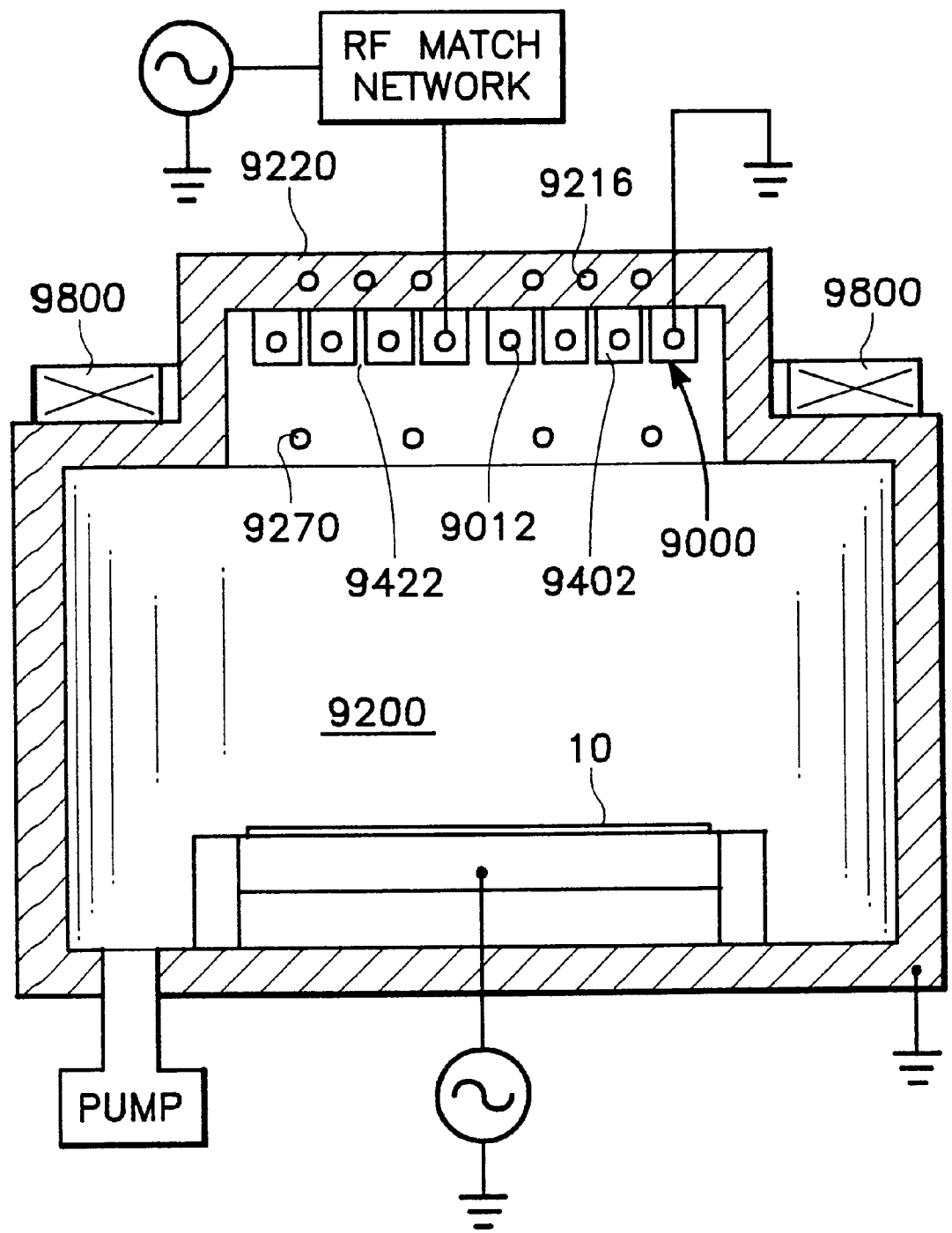
FIG. 14 is a cut away side view of an embodiment of a plasma reactor with an internal inductive antenna capable of generating a helicon wave.

Turning to FIG. 14, in an alternate embodiment of the helicon wave source power applicator, an inductive coil antenna 9000 is disposed within chamber 9200. Plasma is generated within the chamber 9200 from process gas for processing the workpiece 10. The process gas may be introduced into through gas inlet ports 9270 located near the antenna 9000, or through ports located between the coils of the antenna 9000. With the embodiment of FIG. 14, a magnet 9800 surrounds the chamber near the antenna to provide an axial magnetic field of greater than about 5 Gauss at the antenna 9000 to generate the helicon wave.

The antenna coil may have 3–4 turns and be operated at 13.56 MHz to generate an m=0 helicon wave. The chamber 9200 may be operated from about 1 mTorr to about 100 mTorr. This embodiment allows an end launch configuration for a helicon source without an externally defined parallel wavelength, and helicon operation without a separate source region of the chamber.

With this embodiment of the internal inductive antenna, as disclosed in copending parent application by Ye, et al., entitled RF PLASMA ETCH REACTOR WITH INTERNAL INDUCTIVE COIL ANTENNA AND ELECTRICALLY CONDUCTIVE CHAMBER WALLS, incorporated by reference, the antenna may be formed of a conductor 9012 surrounded, partially or completely by a jacket 9402 to prevent sputtering of the conductor 9012. Preferably, the jacket 9402 comprises an electrically non-conducting material surrounding the conductor 9012 and is coupled to the wall 9220, to allow heat to exchange between the chamber wall 9220 and the antenna 9000.

Figure 15:
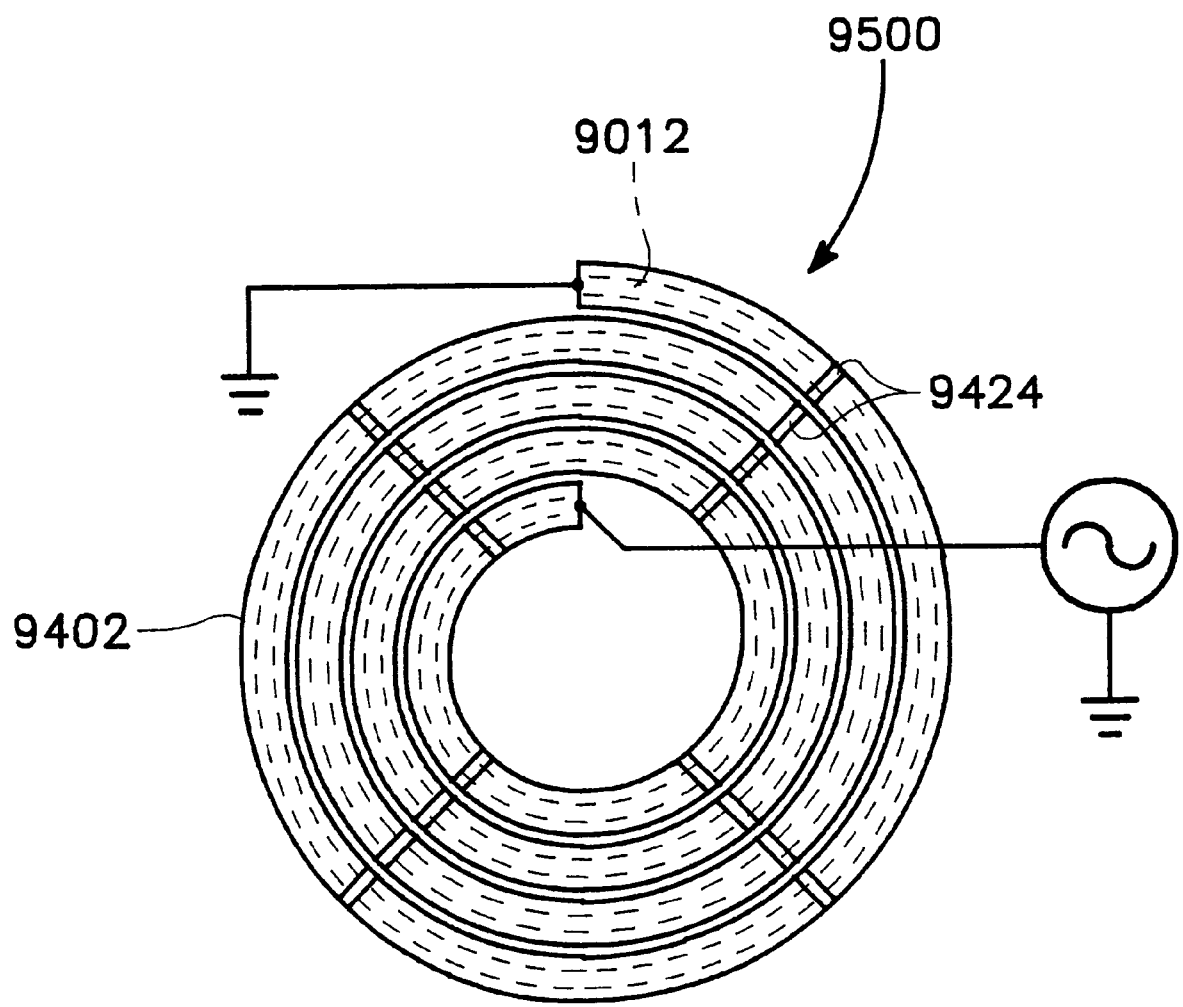
FIG. 15 is a top view of a possible embodiment of the internal inductive antenna of FIG. 14.

Furthermore, as discussed in the referenced copending application, the surface of the antenna 9000 exposed to plasma preferably is separated to inhibit eddy current flow in conductive deposits on the antenna surface. Gaps 9422 segment the exposed surface so as to inhibit conductive material deposited on the jacket from electrically joining the segments. In addition, in some embodiments, it is possible to supply process gas through ports located between the turns of the antenna 9000. Moreover, it is preferred that the coil antenna 9000 also have radial gaps 9424 which separate the surface of the antenna 9500 into arcuate segments as shown in FIG. 15 to inhibit eddy current flow around the antenna.

In another embodiment, the internal inductive coil antenna may be formed of a non-sputtering electrically conductive material and supplied with a flow of coolant through a channel within the antenna, as disclosed in copending parent applications to Ye, et al., and as discussed above.

With the plasma reactor of FIGS. 12–14, the small internal inductive coils as shown and discussed above with reference to FIGS. 1A–11 also may be secured within the processing chamber and used to further control plasma characteristics within the processing chamber.

While the invention has been described in detail by specific reference to preferred embodiments, it is understood that variations and modifications thereof may be made without departing from the true spirit and scope of the invention.

What we claim is:

1. A plasma reactor comprising:
    a) walls defining a chamber, the chamber being adapted to hold a workpiece within for processing with a plasma;
    b) an inductive antenna capable of generating a helicon wave for generating the plasma; and
    c) the antenna being secured within the chamber and wherein the antenna comprises a conductor embedded in a non-sputtering jacket, the jacket being attached to a chamber wall.

2. The plasma reactor of claim 1 wherein the antenna further comprises a conductor embedded in a non-sputtering electrically non-conductive jacket, the jacket being attached to a chamber wall.

3. The plasma reactor of claim 2 wherein the surface of the jacket is segmented to inhibit eddy current flow in conductive deposits on the antenna.

4. The plasma reactor of claim 3 wherein the segmented surface is formed by at least one gap in the surface of the antenna, the at least one gap being formed so as to inhibit conductive material deposited on the jacket from electrically joining segments of the segmented surface.

5. The plasma reactor of claim 4 wherein the antenna is a loop antenna.

6. The plasma reactor of claim 4 wherein the antenna is a coil antenna.

7. The plasma reactor of claim 4 wherein the antenna being secured a chamber wall so that heat generated by the antenna is transferred to the wall by conduction.

8. The plasma reactor of claim 7 wherein the walls of the chamber are electrically conductive.

9. The plasma reactor of claim 7 wherein the chamber comprises a bell shaped portion, and wherein the bell shaped portion is formed of glass.

10. The plasma reactor of claim 1 wherein the non-sputtering jacket is formed of a ceramic material.

11. The plasma reactor of claim 10 wherein the non-sputtering jacket is comprised of aluminum nitride.

12. The plasma reactor of claim 10 wherein the walls of the chamber are electrically conductive.

13. The plasma reactor of claim 1 the antenna being secured a chamber wall so that heat generated by the antenna is transferred to the wall by conduction.

14. The plasma reactor of claim 13 wherein the walls of the chamber are electrically conductive.

15. The plasma reactor of claim 14 wherein the antenna is a loop antenna.

16. The plasma reactor of claim 14 wherein the antenna is a coil antenna.

17. The plasma reactor of claim 1 wherein the antenna is a loop antenna.

18. The plasma reactor of claim 1 wherein the antenna is a coil antenna.

19. The plasma reactor of claim 1 wherein the antenna further comprises a conductor embedded in an electrically non-conducting non-sputtering jacket, the jacket being attached to an electrically conductive chamber wall.

20. The plasma reactor of claim 19 wherein the antenna is a loop antenna.

21. The plasma reactor of claim 19 wherein the antenna is a coil antenna.

22. The plasma reactor of claim 19 the antenna being secured to a chamber wall so that heat generated by the antenna is transferred to the wall by conduction.

23. The plasma reactor of claim 22 wherein the chamber comprises a bell shaped portion, and wherein the bell shaped portion is formed of glass.

24. The plasma reactor of claim 19 wherein the jacket comprises at least one gap.

25. The plasma reactor of claim 19 wherein the non-sputtering jacket is formed of a ceramic material.

26. The plasma reactor of claim 25 wherein the non-sputtering jacket is comprised of aluminum nitride.

27. A plasma reactor comprising:

a) walls defining a chamber, the chamber being adapted to hold a workpiece within for processing with a plasma;

b) an inductive antenna capable of generating a helicon wave for generating the plasma; and c) the antenna being secured within the chamber, the antenna comprising a non-sputtering electrically conductive material exposed to the plasma.

28. The plasma reactor of claim 27 wherein the antenna comprises a ceramic material.

29. The plasma reactor of claim 28 wherein the antenna comprises boron carbide.

* * * * *